US012735314B2

(12) United States Patent
Fiedler et al.

(10) Patent No.: US 12,735,314 B2
(45) Date of Patent: Sep. 15, 2026

(54) DIFFERENTIAL DRIVE OF A SOUND TRANSDUCER SYSTEM

(71) Applicants: ROBERT BOSCH GMBH, Stuttgart (DE); FRAUNHOFER-GESELLSCHAFT ZUR FORDERUNG DER ANGEWANDTEN FORSCHUNG E.V., Munich (DE)

(72) Inventors: Raik Fiedler, Peitz (DE); Matthias Landwehr, Munich (DE); Ralf Hildebrandt, Munich (DE); Franziska Wall, Munich (DE)

(73) Assignee: ROBERT BOSCH GMBH, Stuttgart (DE)

( * ) Notice: Subject to any disclaimer, the term of this patent is extended or adjusted under 35 U.S.C. 154(b) by 259 days.

(21) Appl. No.: 18/768,846

(22) Filed: Jul. 10, 2024

(65) Prior Publication Data

US 2024/0359971 A1 Oct. 31, 2024

(51) Int. Cl.

*H04R 19/00* (2006.01)
*B81B 3/00* (2006.01)
*H04R 19/02* (2006.01)

(52) U.S. Cl.

CPC ......... *B81B 3/0086* (2013.01); *H04R 19/005* (2013.01); *H04R 19/02* (2013.01); *B81B 2201/0257* (2013.01); *B81B 2203/0127* (2013.01); *B81B 2203/04* (2013.01)

(58) Field of Classification Search

CPC ........ H04R 19/02; H04R 19/005; H04R 3/06; H04R 3/00; H04R 19/016; H04R 19/013; H04R 19/00; B81B 2201/0257

See application file for complete search history.

(56) References Cited

U.S. PATENT DOCUMENTS

| | | | | |
|---|---|---|---|---|
| 4,207,442 | A | 6/1980 | Freeman | |
| 5,471,540 | A | 11/1995 | Maeda | |
| 9,961,451 | B2 * | 5/2018 | Nicollini | H04R 19/005 |
| 10,523,162 | B2 * | 12/2019 | Albers | H04R 3/04 |
| 11,225,408 | B2 * | 1/2022 | Wiesbauer | B81B 7/0077 |
| 11,381,923 | B2 * | 7/2022 | Wiesbauer | H04R 3/06 |
| 11,516,594 | B2 * | 11/2022 | Niederberger | H04R 1/406 |
| 2005/0147265 | A1 | 7/2005 | Smits et al. | |
| 2008/0279398 | A1 | 11/2008 | Jansen | |

FOREIGN PATENT DOCUMENTS

| | | | |
|---|---|---|---|
| EP | 2464142 | A2 | 6/2012 |
| WO | 2021223886 | A1 | 11/2021 |
| WO | 2022117197 | A1 | 6/2022 |

OTHER PUBLICATIONS

International Search Report and Written Opinion for PCT/EP2022/050732 dated Oct. 11, 2022.

* cited by examiner

*Primary Examiner* — Disler Paul
(74) *Attorney, Agent, or Firm* — Fletcher Yoder, P.C.

(57) ABSTRACT

This invention relates to an apparatus for differentially driving an electrostatic drive unit of a microelectromechanical sound-generating device implemented in a microelectromechanical system (MEMS). The drive unit has a movable element having a first electrode, which is electrostatically drivable by a second electrode and a third electrode of the drive unit.

20 Claims, 21 Drawing Sheets

DIFFERENTIAL DRIVE OF A SOUND TRANSDUCER SYSTEM

TECHNICAL FIELD

Embodiments of the invention relate to differential driving of sound transducer systems and devices. In some embodiments of the invention, the sound transducer system is a microelectromechanical sound transducer system implemented in a microelectromechanical system (MEMS). In some embodiments, the microelectromechanical sound transducer system is implemented in a chip/die, e.g. in form of a System-on-Chip (SoC) or a System-in-Package (SiP).

BACKGROUND

Sound is a change in pressure over time in an elastic carrier medium, e.g. a fluid, such as air or a liquid. Acting as actuators, loudspeakers generate changes in pressure. Microphones act as sensors and can record changes in pressure and convert them into electrical signals. Loudspeakers and microphones belong to the group of sound transducers, wherein the conversion of the electrical signals into mechanical work or vice versa is usually realized by means of an oscillating unit, such as a membrane. Depending on the field of application, sound transducers can differ greatly from one another in terms of design and size and are found, for example, in loudspeaker boxes, near-field loudspeakers (e.g. integrated in mobile devices such as smartphones), headphones, earbuds or hearing aids. By means of sound output or recording via the sound transducer, sound transducers can realize various functions and facilitate different uses, for example, in the field of entertainment, measurement technology or hearing aid.

Miniaturization of loudspeakers (e.g. for earbuds or hearing aids) demands also smaller sized sound generating structures, which are small enough for the desired application, while still providing sufficient sound pressure and quality. Microelectromechanical systems (MEMS) have been proposed which use a movably arranged interaction structure for interacting with a fluid and an active structure in which an electrical signal is causally related to a deformation of the active structure, which in turn is causally related to the movement of the fluid, are arranged in different MEMS layers. Such MEMS transducers can interact with a volumetric flow of a fluid to provide, e.g. MEMS speakers and MEMS microphones.

The principle of NED (Nanoscopic Electrostatic Drive) is described in WO 2012/095185 A1. NED is a novel MEMS actuator principle (MEMS=microelectromechanical system). Here, a movable element is formed from a silicon material, which has at least two spaced electrodes. The length of the electrodes is much greater than the thickness of the electrodes and also the height of the electrodes, i.e. the dimension along the depth direction of the silicon material. These bar-shaped electrodes are spaced apart from each other and are locally electrically insulated and fixed from each other. By applying an electric potential, an electric field is generated between these electrodes, resulting in attractive or repulsive forces between the electrodes and thus stresses in the material of the electrodes. The material strives to homogenize these stresses by trying to adopt a possible low-stress state, resulting in movement. Through a certain geometry and topography of the electrodes, this movement can be influenced in such a way that the electrodes change in length and thus a lateral movement of the deflectable element takes place.

In an electrostatic drive, the force between at least two electrically charged objects is used to achieve a movement in a desired direction of at least one of the involved or mechanically coupled objects. The simplest example is a plate capacitor where at least one of the two plates is mechanically movably mounted, e.g. by a spring. If both plates are coupled via a common voltage source and a voltage different from zero is applied, the applied electric potential and the resulting electric field result in an attractive force between the two plates (Coulomb's law). A distinction can be made here between three types of movement:

vertical (z-direction): change in plate distance lateral (x- and/or y-direction): change in the mutually overlapping surfaces.

From an electric point of view, the objects directly involved in the generation of the force can be considered capacitively coupled and are referred to below as electrodes.

In addition to the basic variant with two electrodes, a structure with three electrodes is often used in audio technology. The central electrode is separated from the other electrodes, movably mounted and charged with a bias voltage. The resulting force can now be adjusted via voltage changes at the two outer and statically mounted electrodes and the deflection of the central electrode (usually a kind of membrane) can be changed. Conventionally, a differential driving signal is applied to the outer electrodes, as outlined below in connection with FIG. 1 in more detail.

A differential signal routing implies the advantages of a lower susceptibility to interference from the outside as well as a halved amplitude per electrode in comparison to the single-ended variant. Although the required energy requirement remains the same in both variants, the requirements on the electric driver circuit are reduced by reducing the maximum expected output voltages. Regarding fully integrated circuit technology, the inherent symmetry in the differential signal driving results in lower effects due to manufacturing tolerances, voltage and temperature gradients, as well as due to parasitic resistances, inductances and capacitances.

A schematic structure of a three electrodes electrostatic drive is shown in FIG. 1. The central electrode E0 is separated from the other (outer) electrodes E1 and E2. The central electrode E0 is movably mounted and charged with a bias voltage 108 ($V^*_{Rref}$ relative to ground 106). The force acting on the central electrode E0 can be adjusted via voltage changes at the two outer electrodes E1 and E2, which are statically mounted. In the example shown in FIG. 1 control signal $V^*_{E2}(t)$ 104 applied to outer electrode E2 is a 180° phase shifted version of the control signal $V^*_{E1}(t)$ 102 applied to the outer electrode E1 (i.e. $V^*_{E2}(t)=-V^*_{E1}(t)$), thereby realizing differential driving of the outer electrodes E1 and E2, as can be seen in the example waveforms of the potential at the electrodes E0, E1 and E2 over time. The control signals 102, 104 are exemplarily shown as sinusoidal waves at the bottom of FIG. 1 (and several of the following examples) and relative to the fixed potential of the middle electrode E0 at $+V^*_{Ref}$ for exemplary purposes only.

The motivation of an electrostatic drive with three electrodes is based on the quadratic dependence of the resulting force on the applied potential difference. With only two electrodes, a quasi-linear movement of the central electrode E0 is only possible for very small displacement. However, an electromechanical conversion that is as linear as possible is of essential importance for the mentioned fields of application.

With two outer electrodes, the strategy of compensating a non-linear force between electrodes E0 and E1 with a second non-linear and oppositely acting force between electrode E0 and E2. At the bottom of FIG. 1, this can be clearly seen from the respective extremes of electrodes E1 and E2. If there is a minimal potential difference of $|+V^*_{Ref}-V_{max}{}^*_{E1}|$ between electrodes E1 and E0 (where $V_{max}{}^*_{E1}$ is the maximum potential of $V^*_{E1}(t)$), the maximal potential difference between electrodes E2 and E0 is $|+V^*_{ref}-V_{min}{}^*_{E2}|$ (where $V_{min}{}^*_{E2}$ is the minimum potential of $V^*_{E2}(t)$). In the second part of the period, correspondingly reversed conditions arise: If there is a maximal potential difference of $|+V^*_{Ref}-V_{min}{}^*_{E1}|$ between electrodes E1 and E0 (where $V_{min}{}^*_{E1}$ is the minimum potential of $V^*_{E1}(t)$), there is the minimal potential difference between electrodes E2 and E0 is $|+V^*_{ref}-V_{max}{}^*_{E2}|$ (where $V_{max}{}^*_{E2}$ is the maximum potential of $V^*_{E2}(t)$), where $|+V^*_{Ref}-V_{min}{}^*_{E1}|=|+V^*_{ref}-V_{min}{}^*_{E2}|$ and $|+V^*_{ref}-V_{max}{}^*_{E2}|=|+V^*_{Ref}-V_{max}{}^*_{E1}$. Depending on the properties and the nature of the electrostatic drive, the actually non-linear behavior can thus be compensated, and a linear movement becomes possible.

A further schematic structure of a three electrodes electrostatic drive is shown FIG. 2. Here, the central electrode E0 is grounded or can be implemented as a so-called common ground 206. Alternating control signals 202, 204 are modulated onto the outer electrodes E1 and E2, where control signals 202 and 204 are identical in phase, signal form and amplitude. If the circuit diagram in FIG. 2 is changed slightly, the arrangement can be regarded as a parallel connection of two capacitances to a common ground potential E0.

When setting the reference potential $V^*_{ref}$ and maximum and minimum potentials as in the example described in connection with FIG. 1, there will be same minimal and maximal potential differences between the electrodes as in FIG. 1, i.e. $|V_{max}{}^*_{E2}-V^*_{ref}|$ between electrodes E0 and E2 and |Vmax*E1+V*ref between electrodes E0 and E1 in the first half period, and |Vmin*E1+V*ref| between electrodes E0 and E1 and |Vmin*E2−V*ref| between electrodes E0 and E2 in the second half period of the control signals $V^*_{E1}(t)$ and $V^*_{E2}(t)$. The non-linear behavior of an electrostatic drive with only two electrodes can thus also be compensated here. However, two significant disadvantages of this driving structure can be highlighted. On the one hand, the voltages to be processed for the output stages of the outer electrodes E1/E2 increase by the amplitude of the alternating voltage. This does not only increase the requirement specification on the driver circuit, but also on the voltage generation and the potential power consumption itself. On the other hand, the control by the in-phase alternating voltage signals is no longer differential. An externally supplied positive voltage pulse that is equal to |Vmax*E2−V*ref|=|Vmin*E1+V*ref| would reduce the potential difference between outer electrodes E0 and E2 to 0V in the first half period, but would increase the difference between outer electrodes E0 and E1 to |Vmax*E1+V*ref|+|Vmin*E1+V*ref| in the same half period. Thus, the compensation of the non-linearity would no longer be given and a distortion of the desired linear movement of the central electrode E0 would be the result. This behavior could be circumvented if it is ensured that the central electrode E0 behaves similar to the outer electrodes E1 and E2 when there is external interference.

For the configurations shown in FIGS. 1 and 2, it should be emphasized that each control scheme would also continue to function, if a “global” direct voltage offset is added. The resulting potential differences and thus the associated force would not change, if each electrode were increased or decreased by the same voltage value. A grounded electrode E0 such as e.g. in FIG. 2 would thus have to be implemented as a “local” ground and implement the corresponding direct voltage offset.

BRIEF SUMMARY OF THE INVENTION

This Brief Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In the control of an electrostatic drive comprising at three or more electrodes, there exist two basic schemes for driving the electrodes. As shown in FIG. 1, the central electrode E0 is pre-charged with a direct voltage of given polarity. The two outer electrodes E1 and E2 conduct alternating voltage signals which are phase-shifted by 180° relative to each other. The resulting force effects between electrodes E0 and E1 and electrodes E0 and E2 results from the applied potential differences and causes movement of the electrode E0. In another example driving scheme, as shown in FIG. 3, only the central electrode E0 conducts an alternating control signal $V^*_{E0}(t)$ 302 and the two outer electrodes E1 and E2 can be charged with different direct voltage potentials $+V^*_{ref}$ 304 and $-V^*_{ref}$ 306. The resulting force effects between electrodes E0 and E1 and electrodes E0 and E2 results from the applied potential differences.

In the driving scheme of FIG. 3, a capacitively coupled alternating voltage signal of the center electrode E0 can be compensated without problems, when using ideal voltage sources or voltage sources with very low internal resistance to provide the fixed potentials applied to the electrodes E1 and E2. The direct voltage (DC) potentials at the electrode E1 and E2 would thus not change. The implementation of a voltage source having a very low internal resistance has a great disadvantage demanding for high power consumption, which is proportional to the square of the applied voltage.

In many current application scenarios, a low power consumption is, however, a decisive development factor (see A. Amerasekera, “Ultra low power electronics in the next decade”, 2010 ACM/IEEE International Symposium on Low-Power Electronics and Design (ISLPED), 2010, pp. 237-237 and T. K. K. Tsang, M. N. El-Gamal, K. Iniewski, K. Townsend and J. Haslett, “Current status and trends of CMOS low voltage low power wireless IC designs”, The 3rd International IEEE-NEWCAS Conference, 2005, 2005, pp. 1-4). To take this circumstance into account, direct voltage converters (DC/DC converters) such as charge pumps, buck converters and boost converters are tailored to their applications and, in conjunction with output-side voltage regulators, have an optimized internal resistance as a compromise.

In the example of FIG. 3, the voltage sources for the offset potential of $+V^*_{ref}$ and $-V^*_{ref}$ for the electrodes E1 and E2 would thus have to be able to compensate the capacitively coupled alternating voltage signal 302 of the center electrode E0. Otherwise, the potential differences between electrodes E0 and E1 and electrodes E0 and E2, as can be seen in FIG. 4, would remain the same and the electrostatic drive would not be functioning.

Alternatively, a dynamic regulation of the source-side internal resistances could be considered to provide the output-side regulator of the voltage sources providing the offset potential of $+V^*_{ref}$ and $-V^*_{ref}$ for the electrodes E1 and E2 with an adapted impedance range depending on the level of the current to be compensated. The two greatest disadvantages of this solution are the increased complexity of the system in order not to produce any non-linear distortions on the electrodes and the increased power requirement.

A reduction of the problem by the relatively simple addition of further capacitances 502, 504 as capacitive voltage dividers from electrode E1 to the ground 308 of the system and from electrode E2 to the ground 308 of the system would also be conceivable. Depending on the dimensioning of the additional capacitances C1+ and C2+ in FIG. 5, the ripple on the DC voltage electrodes E1 and E2 can thus be minimized. Although the complexity of this compensation approach is kept within limits, this solution requires significantly more chip area or the use of additional external capacitances. Both options would dramatically increase the costs for the overall system (see M. Scheffler and G. Troster, "Assessing the cost effectiveness of integrated passives", Proceedings Design, Automation and Test in Europe Conference and Exhibition 2000 (Cat. No. PR00537), 2000, pp. 539-543) and could not completely compensate for the capacitive coupling.

One aspect of the invention is to suggest a driving scheme for an electrostatic drive system that can avoid the above disadvantages. It is a further aspect of the invention to provide a driving scheme for an electrostatic drive system that can ensure low power consumption with a small chip area.

Aspects of the invention relate to driving of an electrostatic drive unit which has three electrodes. At least one of the electrodes ("first" electrode) is associated with a movable element (sometimes also referred to as an actuator), which can be driven through modulating the other two electrodes ("second" electrode and "third" electrode) using a control signal (sometimes also referred to as a drive signal). In an exemplary use case, the movable element is driven to generate sound. An alternating differential signal is applied as drive signals to the first, second and third electrodes. The drive signals applied to the second and third electrodes are offset relative to each other by a constant or fixed potential difference and alternate relative to the respective fixed offset potentials of the second and third electrodes. Further, to realize differential driving, the first electrode is driven using the inverse (or 180° phase shifted) version of (one of) the drive signals applied to the second and third electrodes, which alternates relative to a potential between the fixed offset potentials of the second and third electrodes.

Although the embodiments of the invention discussed herein below refer to mostly to a "minimal drive arrangement" (sometimes also referred to as a "drive unit" herein) driving a three electrodes structure, the electrostatic drive suggested herein is not limited to those "minimal drive arrangements". A device or apparatus may have a plurality of such minimal drive arrangements, and there may be one or more movable elements within each such "minimal drive arrangement" which can move in the same or opposite direction (depending on the intended function). Furthermore, in another example, the "minimal drive arrangement" may have multiple first electrodes associated with multiple movable elements, but only one second electrode and third electrode. In this example, the same drive signal can be applied to the multiple first electrodes. If there are multiple movable elements in a "minimal drive arrangement", the movable elements may move in the same plane.

Furthermore, embodiments described herein mainly focus on a differential electrostatic driving of one or more movable elements of a drive unit in a sound-generating device. The invention is however not limited to sound-generation. In other embodiments of the invention, the "minimal drive arrangement" and its differential driving scheme may also be used in pumps or valves. For example, a drive unit may be used to open and close a valve in a binary fashion (on/off), in several discrete steps or continuously. In another example embodiment, one or more drive units may be used to realize a pump.

As noted above, some embodiments of the invention relate to an apparatus for driving an electrostatic drive unit of a sound-generating device. The apparatus can also be referred to as a drive circuitry. The drive unit has a movable element having a first electrode (E0), which is electrostatically drivable by means of a second electrode (E1) and a third electrode (E2) of the drive unit. The apparatus further comprises a first drive circuit, which is configured to generate a first electrode signal based on a first drive signal and relative to a first reference potential, and to drive the first electrode (E0) using the first electrode signal. The apparatus has a second drive circuit, which is configured to generate a second electrode signal based on a second drive signal and relative to a second reference potential, which is higher than the first reference potential, and to drive the second electrode (E1) using the second electrode signal. Further, the apparatus has a third drive circuit, which is configured to generate a third electrode signal based on the second drive signal and relative to a third reference potential, which is lower than the first reference potential, and to drive the third electrode (E2) using the third electrode signal. The second and third electrode signals are alternating voltage signals of the same phase. They correspond to each other in terms of their waveform, but they are shifted with respect to one another by the potential difference between the second reference potential and the third reference potential. The first electrode signal is an alternating voltage signal that corresponds to the inverted waveform of (one of) the second and third electrode signals in terms of its waveform.

In some example embodiments, the sound-generating device may be a microelectromechanical sound-generating device. Such microelectromechanical sound-generating device may be implemented not only in a fine-mechanical/discrete manner, but also in a microelectromechanical system (MEMS). Such MEMS may be manufactured using semiconductor methods such as lithography and etching.

In some embodiments, the first drive signal and the second drive signal together form a differential drive signal for the electrodes. The differential drive signal may be a symmetric differential drive signal or an asymmetric differential drive signal. In some embodiments, the second and third electrode signals are alternating voltage signals of the same phase, which correspond to each other in terms of their waveform and amplitude, but are shifted with respect to one another by the potential difference between the second reference potential and the third reference potential.

As an alternative or in addition, the second and third electrode signals may further have or may not have a same signal amplitude thereby realizing symmetric or asymmetric differential driving. For example, in some embodiments, the magnitude of the potential difference between the second reference potential and the first reference potential is equal to the magnitude of the potential difference between the first reference potential and the third reference potential. Thus, the signals driving the second and third electrodes are symmetrically offset relative to the first reference potential.

According to another embodiment, the second drive signal and the third drive signal correspond to the first drive signal shifted in phase by 180°. Hence, the second drive signal and the third drive signal may be inversed or 180° phase shifted versions of the first drive signal (which are offset to the first reference potential by the second and third reference potentials).

In another embodiment, the potential of the second drive signal remains (over time) equal to or higher than the potential of the first drive signal when driving the drive unit. In another embodiment, the potential of the third drive signal remains (over time) equal to or lower than the potential of the first drive signal when driving the drive unit.

In some embodiments, the first drive signal, the second drive signal and the third drive signal are representative of an audio signal to be reproduced by the sound-generating device. The audio signal may be in a frequency range up to 20 KHz. Alternatively, the first drive signal, the second drive signal and the third drive signal are representative of a signal in the ultrasound spectrum (frequency>20 kHz), which may be used e.g. for gesture recognition, or in microfluidics for implementing pump functions when implementing the principled of the invention is a pump.

According to a further embodiment, the first drive signal and the second drive signal may be analog signals. The apparatus may further comprise an inverter circuit, which inverts the first drive signal to generate the second drive signal (or vice versa).

According to some embodiments, the first and second drive signals are analog signals, and the apparatus is further configured to receive a digital drive signal. The apparatus further comprises an inverter, which inverts the digital drive signal; a first digital-to-analog (DAC) converter, which is configured to convert the digital drive signal into an analog signal corresponding to the first drive signal; and a second digital-to-analog converter, which is configured to convert the inverted digital drive signal into an analog signal corresponding to the second drive signal.

In alternative embodiments, digital signal amplitudes of a digital drive signal can be directly applied to the three electrodes. For this, the apparatus is further configured to receive a digital drive signal. The apparatus may further comprise an inverter, which inverts the digital drive signal. The first drive circuit is configured to drive the first electrode (E0) using the digital drive signal as the first drive signal. The second drive circuit and the third drive circuit are configured to drive the second electrode (E1) and the third electrode (E2) using the inverted drive signal as the second drive signal and third drive signal, respectively. Note that it is also possible that the digital drive signal is used to drive the second and third electrodes (E1, E2) and is inverted for generating the drive signal.

In some embodiments of the invention, the apparatus further comprises a second constant voltage source configured to provide the second reference potential to the second drive circuit and a third constant voltage source configured to provide the third reference potential to the third drive circuit. In an implementation example, the second constant voltage source comprises a DC/DC converter stage configured to receive a positive potential from a battery and to generate the second reference potential based on a positive potential of the battery powering the apparatus and the MEMS-based component, and a low-dropout (LDO) regulator configured to receive the second reference potential from the DC/DC converter and to provide a regulated second reference potential to the second drive circuit. Further, the third constant voltage source comprises a DC/−DC converter stage configured to receive the positive potential from the battery and to generate the third reference potential based on the positive potential of the battery, and a low-dropout (LDO) regulator configured to receive the third reference potential from the DC/−DC converter and to provide a regulated third reference potential to the third drive circuit. Please note that reference to a "DC/−DC" converter denotes a DC/DC converter that inverts the polarity of the output.

In some example implementations, the first reference potential received by the first drive circuit is the negative potential of a battery powering the apparatus and the MEMS-based component. Alternatively, in some example implementations, the apparatus may also comprise a second constant voltage source configured to provide the second reference potential to the second drive circuit.

Another embodiment of the invention relates to an apparatus for driving an electrostatic drive unit of a sound-generating device. The drive unit comprises a first movable element having a first electrode (E0), which is electrostatically drivable by means of a second electrode (E1) and a third electrode (E2) of the drive unit. The first movable element or a second movable element comprised by the drive unit has a fourth electrode (E0') which is electrostatically drivable by means of a fifth electrode (E1') and a sixth electrode (E2') of the drive unit. The apparatus comprises a drive circuit, which is configured to generate a first electrode signal based on a drive signal and relative to a first reference potential, and to drive the first electrode (E) using the first electrode signal, wherein the drive circuit is further configured to invert the first electrode signal and to drive the fourth electrode (E0') using the inverted first electrode signal. The drive circuit is further configured to apply a second reference potential, which is higher than the first reference potential, to the second electrode (E1) and the sixth electrode (E2') and to apply a third reference potential, which is lower than the first reference potential, to the third electrode (E2) and the fifth electrode (E1').

Yet another embodiment provides an apparatus for driving an electrostatic drive unit of a sound-generating device. In this embodiment, the drive unit comprises a first movable element having a first electrode (E0), which is electrostatically drivable by means of a second electrode (E1) and a third electrode (E2) of the drive unit. The drive unit further comprises a second movable element having a fourth electrode (E0'), which is electrostatically drivable by means of a fifth electrode (E1') and a sixth electrode (E2') of the drive unit. The apparatus comprises a drive circuit, which is configured to generate a first electrode signal based on a drive signal and relative to a first reference potential, and to drive the first electrode (E0) using the first electrode signal. The drive circuit is further configured to invert the first electrode signal and to drive the fourth electrode (E0') using the inverted first electrode signal and to apply a second reference potential, which is higher than the first reference potential, to the second electrode (E1) and the fifth electrode (E1') and to apply a third reference potential, which is lower than the first reference potential, to the third electrode (E2) and the sixth electrode (E2').

In the two embodiments above, the sound-generating device may be a microelectromechanical sound-generating device implemented in a microelectromechanical system (MEMS).

Further embodiments of the invention relate to a loudspeaker system. The loudspeaker system comprises a sound-generating device which is configured to generate sound using one or more drive units, wherein each drive unit comprises a movable element having a first electrode (E0), which is electrostatically drivable by means of a second electrode (E1) and a third electrode (E2) of the drive unit;

and an apparatus according to one of the different embodiments discussed herein above and configured to differentially drive the drive unit.

In another embodiment, each drive unit of the loudspeaker system comprises a plurality of movable elements. Each of the movable elements has a first electrode (E0), which is electrostatically drivable by means of a second electrode (E1) and a third electrode (E2) of the drive unit. The apparatus is configured to differentially drive the movable elements of the one or more drive units.

In a further embodiment, each drive unit of the loudspeaker system comprises one or more of movable elements, each of the movable elements having a first electrode (E0), which is electrostatically drivable by means of a second electrode (E1) and a third electrode (E2) of the drive unit. The loudspeaker system comprises a plurality of apparatus according to one of the different embodiments discussed herein above, wherein each apparatus is configured to differentially drive at least one of the one or more drive units.

In some example embodiments, the loudspeaker system is a microelectromechanical loudspeaker system implemented within a System on Chip (SoC) or System in Package (SiP).

Further embodiments of the invention relate to a device with a loudspeaker system according to one of the different embodiments discussed herein above, wherein the device is a near-field speaker, a headphone, or a hearing aid.

The different aspects and embodiments of the invention may also be implemented in a driving method or a computer-readable mediums, storing instructions that when executed in a loudspeaker system comprising an apparatus according to the embodiments of the invention, cause the apparatus to perform such driving method.

Accordingly, a further embodiment relates to a method for driving an electrostatic drive unit of a sound-generating device, wherein the drive unit has a movable element having a first electrode (E0), which is electrostatically drivable by means of a second electrode (E1) and a third electrode (E2) of the drive unit. The method comprises: generating a first electrode signal based on a first drive signal and relative to a first reference potential, and to drive the first electrode (E0) using the first electrode signal; generating a second electrode signal based on a second drive signal and relative to a second reference potential, which is higher than the first reference potential, and to drive the second electrode (E1) using the second electrode signal; and generating a third electrode signal based on the second drive signal and relative to a third reference potential, which is lower than the first reference potential, and to drive the third electrode (E2) using the third electrode signal, wherein the second and third electrode signals are alternating voltage signals of the same phase, which correspond to each other in terms of their waveform, but are shifted with respect to one another by the potential difference between the second reference potential and the third reference potential; and wherein the first electrode signal is an alternating voltage signal that corresponds to the inverted waveform of the second and third electrode signals in terms of its waveform.

Another embodiment relates to a method for driving an electrostatic drive unit of a sound-generating device, wherein the drive unit comprising a first movable element having a first electrode (E0), which is electrostatically drivable by means of a second electrode (E1) and a third electrode (E2) of the drive unit, wherein the first movable element or a second movable element comprised by the drive unit has a fourth electrode (E0') which is electrostatically drivable by means of a fifth electrode (E1') and a sixth electrode (E2') of the drive unit. The method comprises: generating a first electrode signal based on a drive signal and relative to a first reference potential, and to drive the first electrode (E0) using the first electrode signal; inverting the first electrode signal and to drive the fourth electrode (E0') using the inverted first electrode signal; applying a second reference potential, which is higher than the first reference potential, to the second electrode (E1) and the sixth electrode (E2'); and applying a third reference potential, which is lower than the first reference potential, to the third electrode (E2) and the fifth electrode (E1').

Yet another embodiment relates to a method for driving an electrostatic drive unit of a sound-generating device, wherein the drive unit comprises a first movable element having a first electrode (E0), which is electrostatically drivable by means of a second electrode (E1) and a third electrode (E2) of the drive unit, and a second movable element having a fourth electrode (E0'), which is electrostatically drivable by means of a fifth electrode (E1') and a sixth electrode (E2') of the drive unit. The method comprises: generating a first electrode signal based on a drive signal and relative to a first reference potential, and to drive the first electrode (E0) using the first electrode signal; inverting the first electrode signal and to drive the fourth electrode (E0') using the inverted first electrode signal; applying a second reference potential, which is higher than the first reference potential, to the second electrode (E1) and the fifth electrode (E1'); and applying a third reference potential, which is lower than the first reference potential, to the third electrode (E2) and the sixth electrode (E2').

BRIEF DESCRIPTION OF THE DRAWINGS

The present description will be better understood from the following detailed description read in light of the accompanying drawings, wherein like reference numerals are used to designate like parts in the accompanying description.

DETAILED DESCRIPTION

Figure 1:
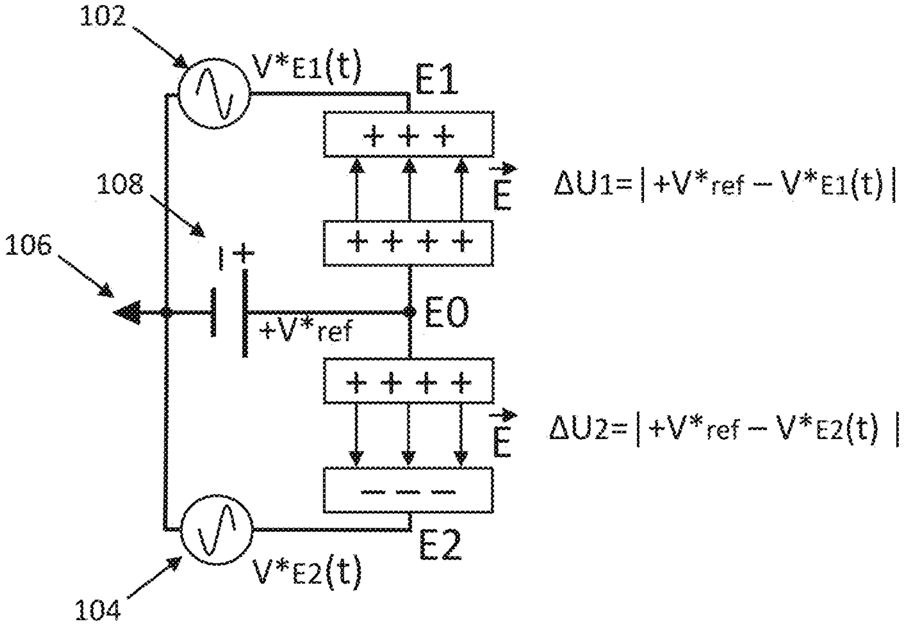
FIG. 1 shows a first schematic structure of a three electrodes electrostatic drive.
Figure 1:
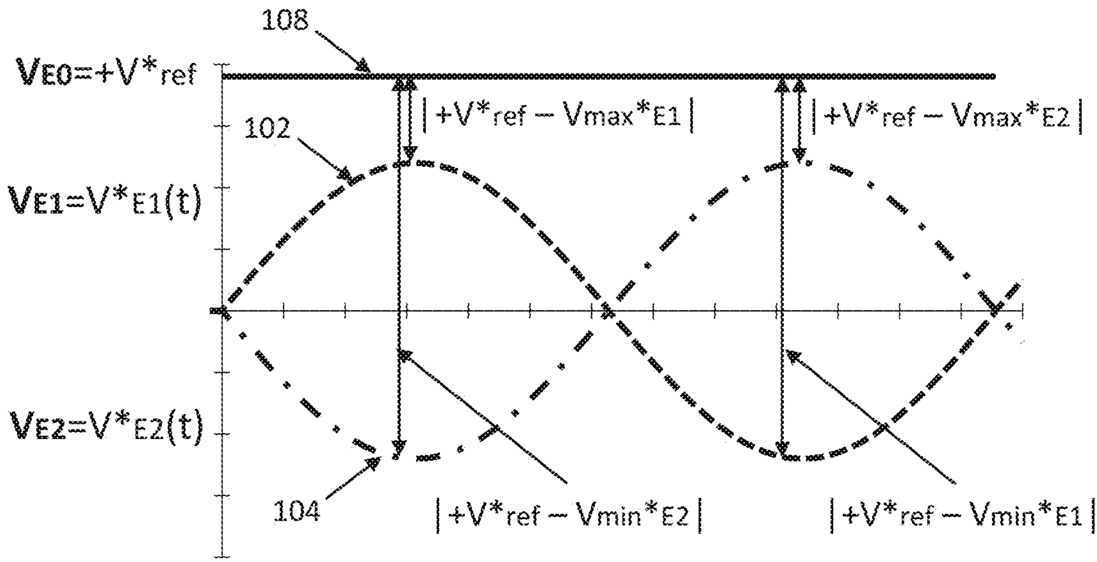
Figure 2:
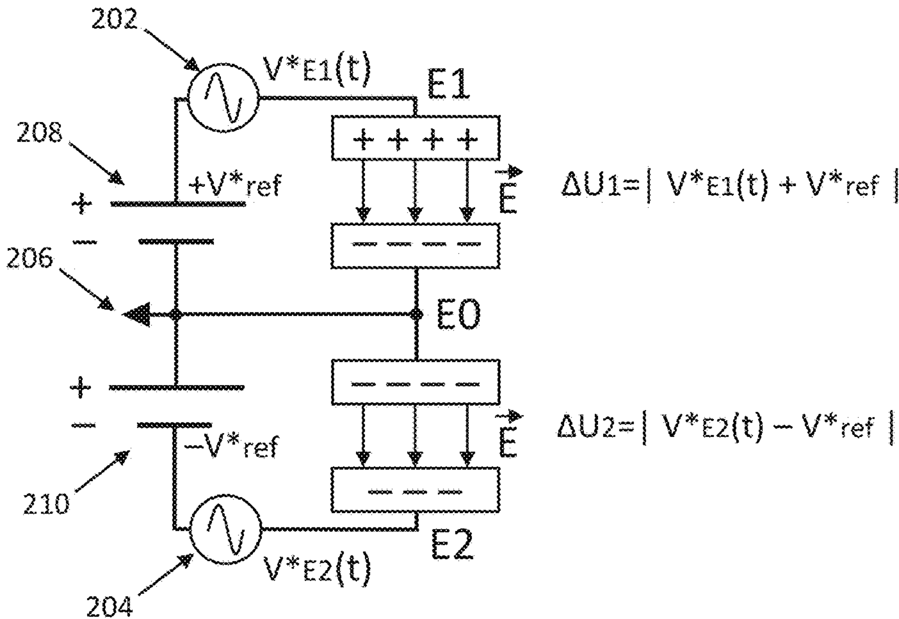
FIG. 2 shows a second schematic structure of a three electrodes electrostatic drive.
Figure 2:
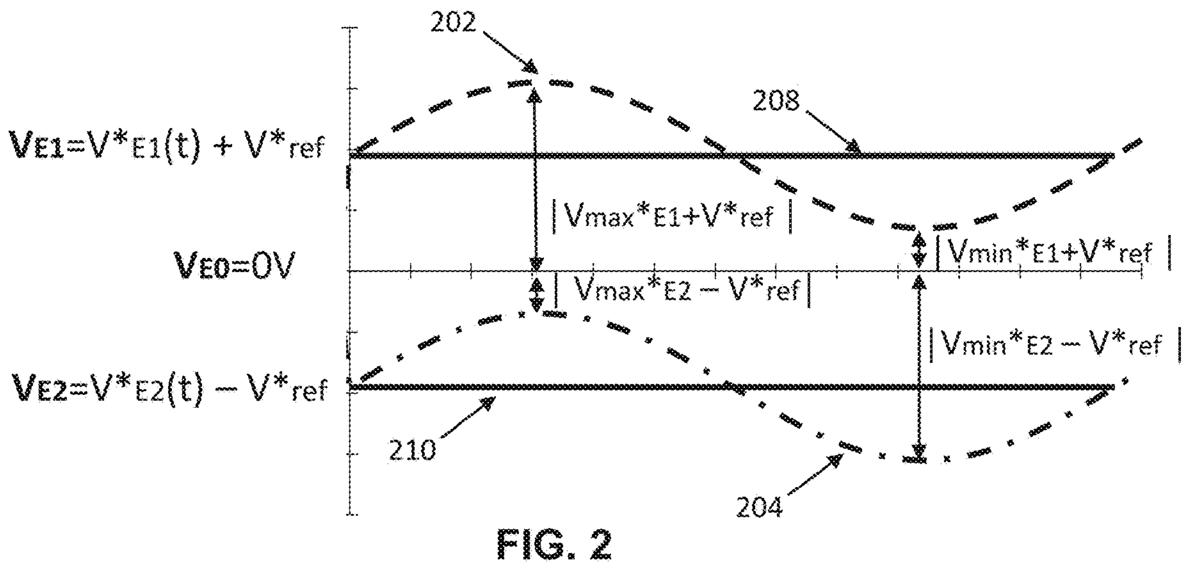

Different embodiments of the invention will be outlined in the following in more detail. As noted, this disclosure generally relates aspects of the invention relate to differential driving of an electrostatic drive unit which has three or more electrodes. At least one of the electrodes ("first" electrode) is associated with a movable element (sometimes also referred to as an actuator), which can be driven through modulating the other two electrodes ("second" electrode and "third" electrode) using a control signal (sometimes also referred to as a drive signal).

In some embodiments an electrostatic force is generated between the first electrode and the second electrode (that may be considered to form a first capacitor), pulling the movable element towards one direction, while another electrostatic force is generated between the first and the third electrode (that may be considered to form a second capacitor), pulling the movable element in the opposite direction. When no drive signal is applied, said forces are in equilibrium and there is no force acting on the movable element. Upon applying a drive signal, one of said electrostatic forces is diminished, while the other is enhanced, depending on the sign of the drive signal. In this case a net force is the result which drives the movable element in the respective direction. In line with this idea of electrostatic driving, in some embodiments, the first electrode may be "between" the second and third electrodes in terms of the electrostatic drive being realized by the electric fields between the second and first electrodes and between the first and third electrodes responsive to the drive signals applied to the three electrodes. In some embodiments, the first electrode may be an electrode positioned (physically) between the second and third electrodes, which form the outer electrodes. In the following both implementations are referred to when denoting the first electrode as a center electrode.

According to embodiments of this aspect, an alternating differential signal is applied as drive signals to the first, second and third electrodes. The drive signals applied to the second and third electrodes are offset relative to each other by a constant or fixed potential difference and alternate relative to the respective fixed offset potentials of the second and third electrodes. A "fixed offset potential" is sometimes denoted a reference potential herein. Further, to establish the differential driving of the electrodes, the first electrode may be driven using the inverse (or 180° phase shifted) version of (one of) the drive signals applied to the second and third electrodes, which alternates relative to a potential between the fixed offset potentials of the second and third electrodes.

Embodiments of this aspect of the invention encompass symmetric differential driving, where the signal waveforms and signal amplitudes of the drive signals applied to the three electrodes are identical (except for the 180° phase shift of the drive signal for the first electrode relative to the drive signals of the second and third electrodes). The drive signals of the second and third electrodes thus have the same phase (i.e. are in phase). Other embodiments of this aspect of the invention encompass asymmetric differential driving, where the signal waveforms of the drive signals applied to the three electrodes are identical (except for the 180° phase shift of the drive signal for the first electrode relative to the drive signals of the second and third electrodes), but the signal amplitudes may be different. For example, in one embodiment of an asymmetric differential driving scheme, the signal amplitude of the drive signal applied to the first electrode may be different to the signal amplitude of the drive signals applied to the second and third amplitude. The drive signals of the second and third electrodes have the same phase and same signal amplitude. Hence the drive signals of the second and third electrodes are in phase and can also be denoted in phase drive signals. In another embodiment of an asymmetric differential driving scheme, the signal amplitude of the drive signal applied to the first electrode may be different to the signal amplitudes of the drive signals applied to the second and third amplitude. The drive signals of the second and third electrodes have the same phase, but different signal amplitudes.

In embodiments of the invention, (one or more) movable element(s) or actuator(s) of a drive unit are displaced by modulating drive signals applied to the three electrodes. In an example use of a drive unit, the displacement of the actuator(s) may cause displacement of a fluid (e.g. air), for example, to generate sound. In some embodiments, the second and third electrodes are fixed and do not move. In other embodiments, the second and third electrodes may be provided as part of respective movable elements so that all movable elements of the drive unit are moving responsive to the drive signals applied to the three electrodes. In yet some further embodiments, the first (e.g. center) electrode may be fixed and not movable, whereas the second and third electrodes could be provided on or in respective movable elements. If there are multiple movable elements in the drive unit, those movable elements may be moving in parallel in a same plane and/or in planes that are parallel to each other.

Figure 6:
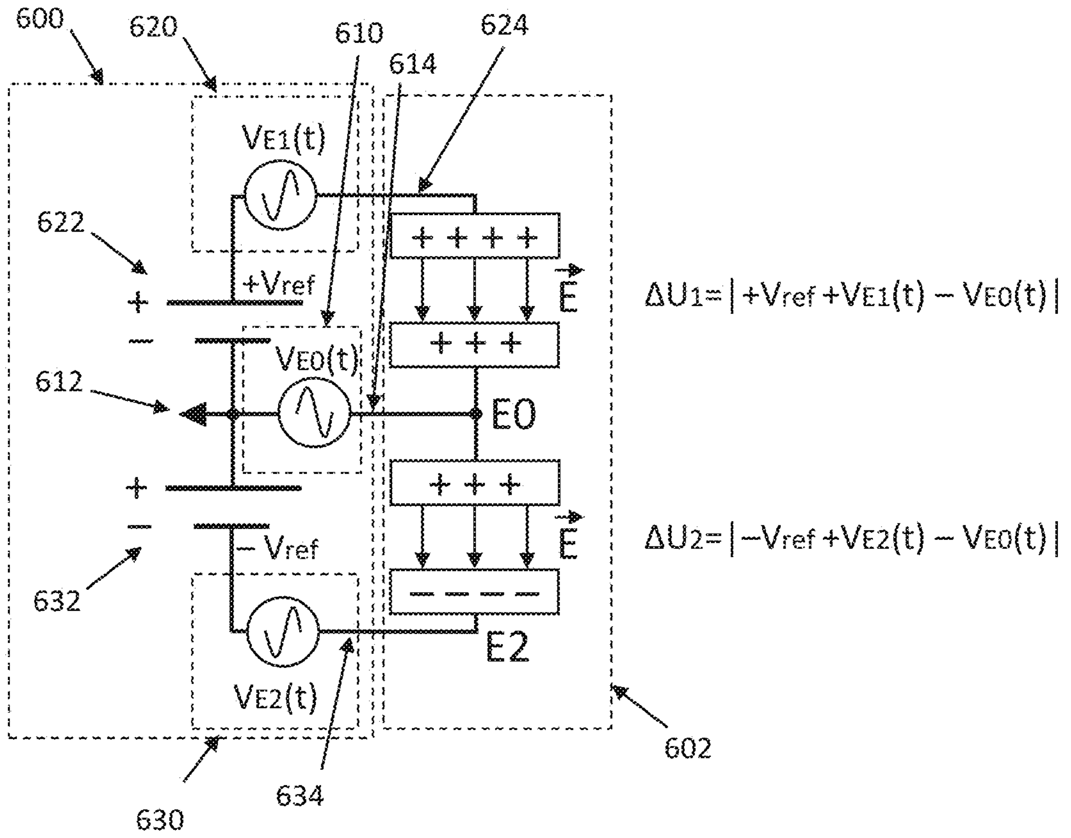
FIG. 6 shows a schematic structure of a three electrodes electrostatic drive according to an exemplary embodiment of the invention.
Figure 6:
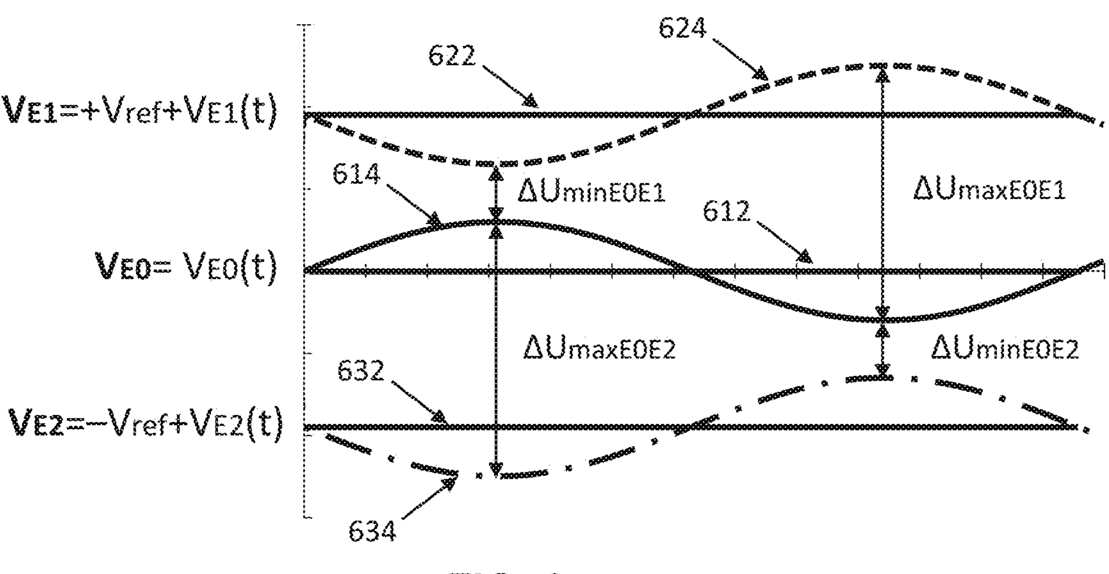

In the following, an exemplary embodiment of the invention is described in connection with FIG. 6. FIG. 6 shows a schematic structure of a three electrodes electrostatic drive circuitry 600 according to an exemplary embodiment of the invention. Drive circuitry 600 connects to (one or more) drive unit(s) 602 to displace a one or more movable elements provided within each drive unit 602. Like FIGS. 1 to 4, a center electrode E0 is separated from the other (outer) electrodes E1 and E2 of the drive unit 602. In this example embodiment, the center electrode E0 is movably mounted to or formed by a movable element within the drive unit 602. In case the drive unit 602 has more than one movable element, plural the center electrode E0 might be provided on or formed by the movable elements of the drive unit 602. The outer electrodes E1 and E2 may be statically mounted within the drive unit 602. In general, the outer electrodes E1 and E2 could also be provided on or part of movable elements. Furthermore, one of the outer electrodes E1 and E2 or both may be provided as individual electrode segments which may be advantageous when driving center electrodes E0 of multiple movable elements provided within a single drive unit 602 (see FIG. 13). A first drive unit 610 of the drive circuitry 600 drives the first electrode E0, a second drive unit 620 of the drive circuitry 600 drives the second electrode E1, and a third drive unit 630 of the drive circuitry 600 drives the third electrode E3.

The force acting on the central electrode E0 can be adjusted via voltage changes at the two outer electrodes E1 and E2. When implementing a symmetric diving scheme, the drive signals $V_{E1}(t)$ and $V_{E2}(t)$ applied to outer electrodes E1 and E2 are a 180° phase shifted version of the drive signal $V_{E0}(t)$ applied to the center electrode E0 and the signal amplitudes of the drive signals are identical, i.e. $V_{E0}(t)=-V_{E1}(t)=V_{E2}(t)$ and/or $V_{E0}(t)=-V_{E2}(t)$. In the example embodiment of FIG. 6, the drive signals $V_{E1}(t)$ and $V_{E2}(t)$ of the second electrode E1 and the third electrode E2 are both an offset relative to a reference potential 612 of the drive signal of the first electrode E0 by offset potentials 622 and 632 which are denoted "$+V_{ref}$" and "$-V_{ref}$" in FIG. 6 to indicate the opposite polarity of the offset potentials 622 and 632. Offset potentials 622 and 632 thus form the reference potentials which are modulated in the second drive unit 620 and third drive unit 630 by the drive signals $V_{E1}(t)$ and $V_{E2}(t)$ to generate the electrode signals 624 and 634 applied to the second and third electrodes E1, E2. Furthermore, first drive unit 610 modulates the reference potential 612 by the drive signal $V_{E0}(t)$ to generate the electrode signal 614 driving the center electrode E0. In the shown example, the reference potential 612 is the common ground potential, which may be for example provided by the minus pole of a battery powering the drive units. In general, it is also possible to implement a global DC offset by properly defining the reference potentials 612, 622 and 632.

In the example embodiment of FIG. 6, the electrostatic drive unit 602 is to be moved via a differential control scheme, which can compensate non-linear force effects caused by the differential drive principle. Thus, at a given potential difference $\Delta U_1$ between the electrodes E0 and E1, a potential different $\Delta U_2$ causing an opposing resulting force must be present between electrodes E0 and E2 at the same time. Depending on this force ratio, the movable element (comprising the center electrode E0) of the drive unit 602 can be deflected linearly and, in the event of a force equilibrium, remains in a rest position. Depending on the construction of the drive unit 602, this rest position does not necessarily have to be exactly central between the outer electrodes E1 and E2, but can be selected arbitrarily by structural measures, such as electrode spacings of different sizes or asymmetrical DC voltage potentials.

To simplify the explanations of this and the following embodiments and the associated advantages, a fully symmetrical differential drive of the drive unit(s) 602 has been considered (i.e. $V_{E0}(t)=-V_{E1}(t)$ and/or $V_{E0}(t)=-V_{E2}(t)$). As noted above, it is also possible to implement asymmetrical differential driving of the drive unit(s). When implementing an asymmetric drive scheme, the signal amplitudes of $V_{E0}(t)$, $V_{E1}(t)$ and/or the signal amplitudes of $V_{E0}(t)$ and $V_{E2}(t)$ are selected to be different from each other. All three signal amplitudes may be different from each other. Further, the reference potentials 622, 632 (denoted "$+V_{ref}$" and "$-V_{ref}$" in FIG. 6) provide a symmetrical offset relative to the reference potential 612. However, this is not mandatory, i.e. different offsets of the reference potentials 622, 632 relative to the reference potential 612 can also be used. In another example of asymmetric driving, the signal amplitudes of $V_{E1}(t)$ and $V_{E2}(t)$ are the same, but they are different from the signal amplitude $V_{E0}(t)$. For symmetric driving, signal amplitudes of $V_{E0}(t)$, $V_{E1}(t)$ and $V_{E2}(t)$ are all identical.

Figure 3:
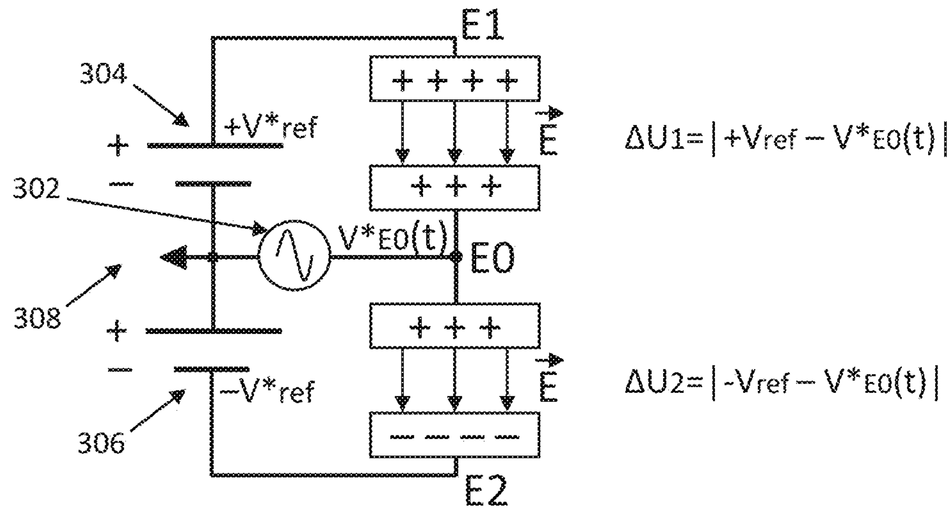
FIG. 3 shows a third schematic structure of a three electrodes electrostatic drive.
Figure 3:
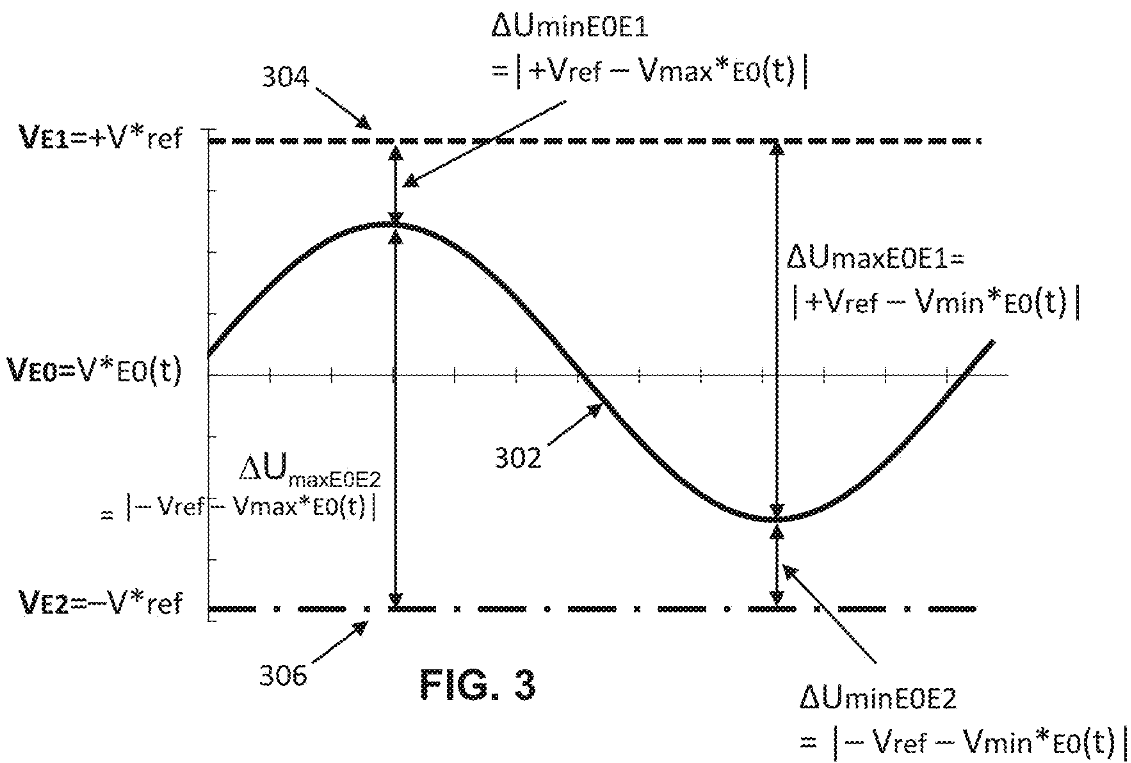
Figure 4:
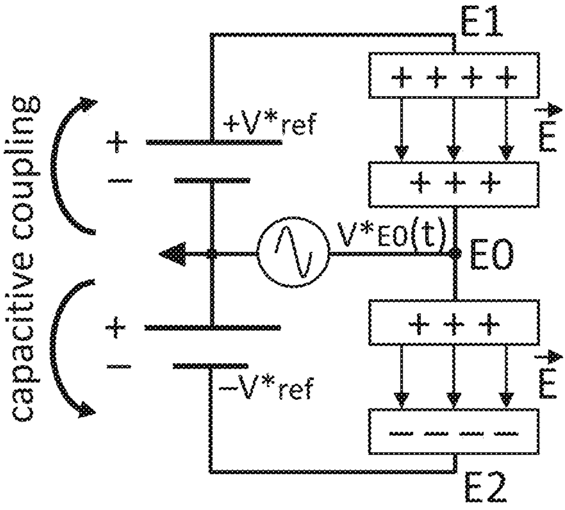
FIG. 4 shows a capacitive coupling in the third schematic structure of a three electrodes electrostatic drive according to FIG. 3, which can cause malfunction of the electrostatic drive.
Figure 4:
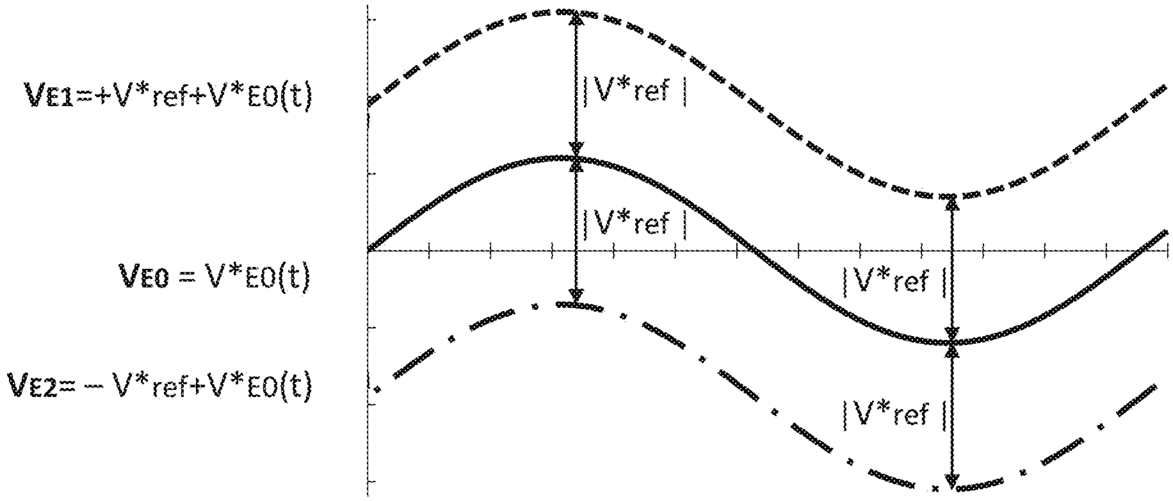
Figure 5:
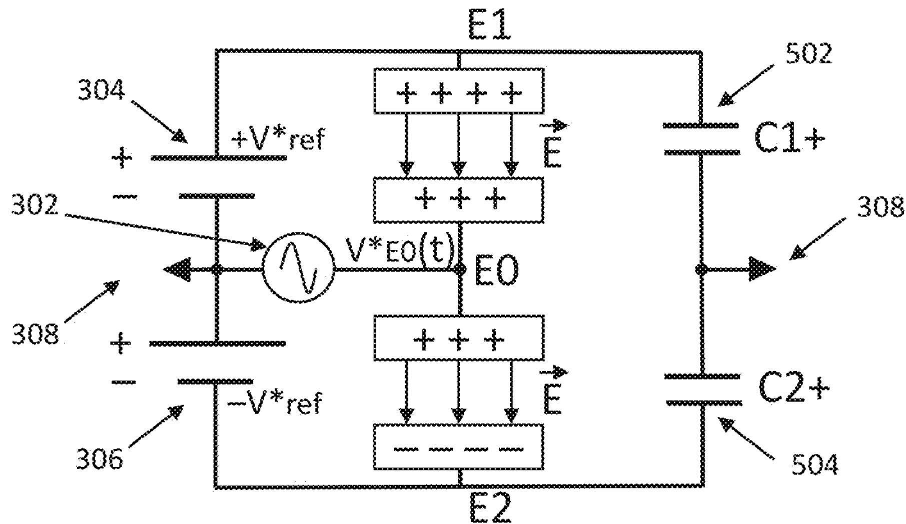
FIG. 5 shows an improvement of the third schematic structure of a three electrodes electrostatic drive according to FIG. 3 that can reduce the capacity coupling.

Further, in comparison to the single-phase control in FIG. 3, it is possible to substantially reduce power consumption. Considering the case of symmetric driving, when setting the reference potentials 612, 622, 624 in FIG. 6 as in FIG. 3 (i.e. common ground for reference potential 612, $+V_{ref}$ for reference potential 622, and $-V_{ref}$ for reference potential 624), the signal amplitudes of $V_{E0}(t)$, $V_{E1}(t)$ and $V_{E2}(t)$ can be ½ (half) of the signal amplitude of the drive signal $V^*_{E0}(t)$ in FIG. 3, while still obtaining the same maximum potential differences $\Delta U_{maxE0E1}$ and $\Delta U_{maxE0E2}$ and same minimum potential differences $\Delta U_{minE0E1}$ and $\Delta U_{minE0E2}$ as in FIG. 3 between the electrodes E1 and E0 and the electrodes E0 and E2. The reactive power for signal variations of $V^*_{E0}(t)$ in FIG. 3 applied to the capacitors between the central electrode E0 and the outer electrode E1 (i.e. $C_{E0E1}$) and between the central electrode E0 and the outer electrode E2 (i.e. $C_{E0E2}$) corresponds to the total reactive power for signal variations of $V_{E0}(t)$ in FIG. 6 (which is ½ of the signal amplitude) applied to the capacitors between the central electrode E0 and the outer electrode E1 (i.e. $C_{E0E1}$) and between the central electrode E0 and the outer electrode E2 (i.e. $C_{E0E2}$) and, additionally, signal variations of $V_{E0}(t)$ applied to the capacitors between the outer electrode E1 and the center electrode E0 (i.e. $C_{E1E0}$) and between the outer electrode E2 and the center electrode E0 (i.e. $C_{E2E0}$) in FIG. 6 due to a quadratic dependence of the resulting reactive power on the voltage.

Since the changes in amplitude of the electrode signals 614, 624, 634 in FIG. 6 are only one half of the changes in amplitude to the electrode signal, the requirements on the design of the circuit electronics are simplified. The susceptibility to external interference by the differential control is likewise virtually eliminated. If an external voltage pulse is coupled in, the electrodes' potentials are changed in the same way and the movement of the movable element in the drive unit 602 is not distorted.

Further, it becomes possible to use identical output stages for each of the three electrodes E0, E1 and E2, as will be outlined below in more detail.

With the approach suggested in FIG. 6, each electrode of the electrodes E0, E1 and E2 also has a possibility of changing the output-side voltage applied by the respective drive circuits 610, 620, 630 as the electrode signals 614, 624, 634. These output stages 610, 620, 630 operate differentially with respect to one another. Thus, in case of a fully symmetrical control, if the voltage at the electrode E0 increases, the voltages at electrodes E1 and E2 are reduced to the same extent at the same time. The currents capacitively coupled in from electrode E0 to electrodes E1 and E2 through the electric field between the respective electrode pairs are thus led away from the electrodes E1 and E2 by the drive circuits 610, 620, 630 and at the same time the potential at electrodes E1 and E2 is lowered. As a result, the capacitive coupling is compensated linearly with the AC voltage signals 624, 634 at the electrodes E1 and E2 (which are opposite in phase compared to the AC voltage signal 614) and the movable element associated with the electrode E0 is moved linearly with a correct choice of the force equilibrium. The voltage ratios circulate over the course of a period as illustrated at the bottom of FIG. 6, as already described earlier.

The choice of the force equilibrium is also dependent on the systemic implementation of the drive unit 602 or sound-generating device. If the sound-generating device is to be embodied in a MEMS, a fully symmetrical differential control as exemplified in FIG. 6 is advantageous (but not mandatory). The electrodes E0, E1, E2 of plural drive units 602 may be arranged in an electrode array lie very close to one another (e.g. in the same plane). The electrodes E0, E1, E2 in such electrode array may not only have the same spacings relative to each other, but also the same physical properties. A symmetric control with the same signal amplitudes and identical (absolute) magnitude differences the DC voltage offsets "$+V_{ref}$" and "$-V_{ref}$" of the electrode signals 614, 624, 634 thus constitutes a very simple solution.

By contrast, for a more macroscopic implementation with e.g. discrete components (for example for loudspeakers for free-space sound irradiation), the properties of the electrodes and also the external general conditions, such as e.g. the size of the front volume or rear volume of the arrangement, can differ considerably. Depending on the design, an asymmetrically differential control can thus be technically expedient and different signal amplitudes and DC voltage offset components can be used for each of the electrodes.

As outlined above, when implementing a symmetric diving scheme, the drive signals VE1(*t*) and VE2(*t*) applied to outer electrodes E1 and E2 are a 180° phase shifted version of the drive signal VE0(*t*) applied to the center electrode E0 and the signal amplitudes of the drive signals are identical, i.e. VE0(*t*)=−VE1(*t*)=−VE2(*t*).

Figure 7:
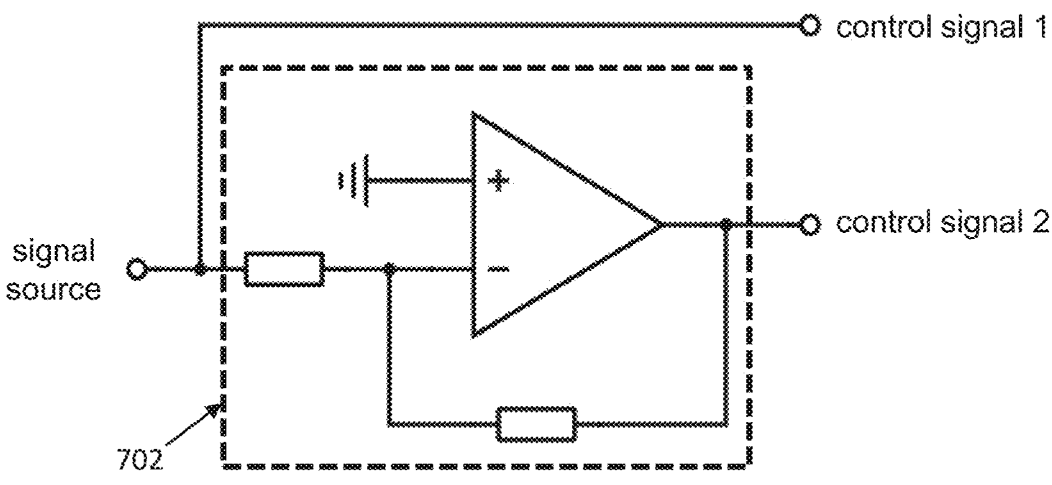
FIG. 7 shows a circuit arrangement to produce a differential drive signal from an analog source signal according to an embodiment of the invention.

Assuming that the drive signals for the first electrode E0 and the second and third electrodes E1 and E2 are derived from an analog signal source, an inverter circuit 702 as illustrated in FIG. 7 can be used to derive the drive signal VE1(*t*) and VE2(*t*) from the drive signal VE0(*t*) (or vice versa). In the embodiment of the circuit arrangement in FIG. 7 may be used to produce a differential drive signal from the source signal. The source signal may be for example an audio signal which is output by an audio stage of the sound-generating device. Optionally, the signal path outputting control signal 1 as one drive signal may further include some delay elements to compensate for the time delay introduced by the inverter circuit 702. The output of the inverter circuit 702 provides control signal 2 as the other, second drive signal, which is the 180° phase shifted version of control signal 1. As noted, control signal 1 corresponds to the drive signal VE0(*t*) and control signal 2 corresponds to the drive signals VE1(*t*) and VE2(*t*) in FIGS. 7 and 8 (or vice versa).

Alternatively, in some embodiments, the signal source may provide a digital source signal. In this case, a digital inverter 802 may be used to generate an inverted version of the source signal, as highlighted in FIG. 8. If the electrodes are to be driven by analog signals, two digital-analog-converters (DACs) 804, 806 may be used to convert the digital source signal and its inverted version output by the inverter 802 inter-respective analog drive signals, denoted as control signal 1 and control signal 2. As in the example of FIG. 7, control signal 1 corresponds to the drive signal VE0(*t*) at the center electrode E0 and control signal 2 corresponds to the drive signals VE1(*t*) and VE2(*t*) at the outer electrodes E1 and E2 in FIG. 6 (or vice versa).

In a further alternative embodiment, control signals 1 and 2 could be also digital signals, i.e. the digital signal amplitudes are used to drive the electrodes E0, E1, and E2 as described in connection with FIG. 6. Accordingly, in this case the circuitry of FIG. 8 might not include the DACs 804, 806, but output the source signal and its inverted version directly as control signal 1 and control signal 2. Like the example in connection with FIG. 7, the signal path outputting the control signal 1 and FIG. 8 might also include some delay element in order to compensate for any time delay introduced by the inverter 802. This allows to ensure that control signal 1 and control signal 2 are in phase with one another. In a further alternative implementation the source signal could be a differential signal that is applied to the electrodes directly or through an amplifier stage as drive signals $V_{E1}(t)=V_{E2}(t)$ and $V_{E0}(t)$. This differential signal can be analog or digital.

In the embodiments described herein, the drive signals may optionally be amplified by respective amplifier stages prior to application to the electrodes E0, E1, and E2 as electrode signals 614, 624 and 634, as outlined below in connection with FIGS. 9 to 11.

Figure 8:
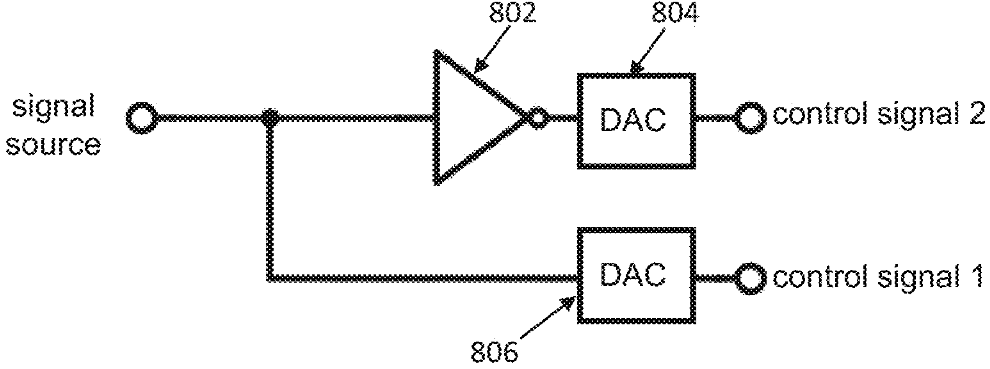
FIG. 8 shows a circuit arrangement to produce a differential drive signal from a digital source signal according to an embodiment of the invention.
Figure 9:
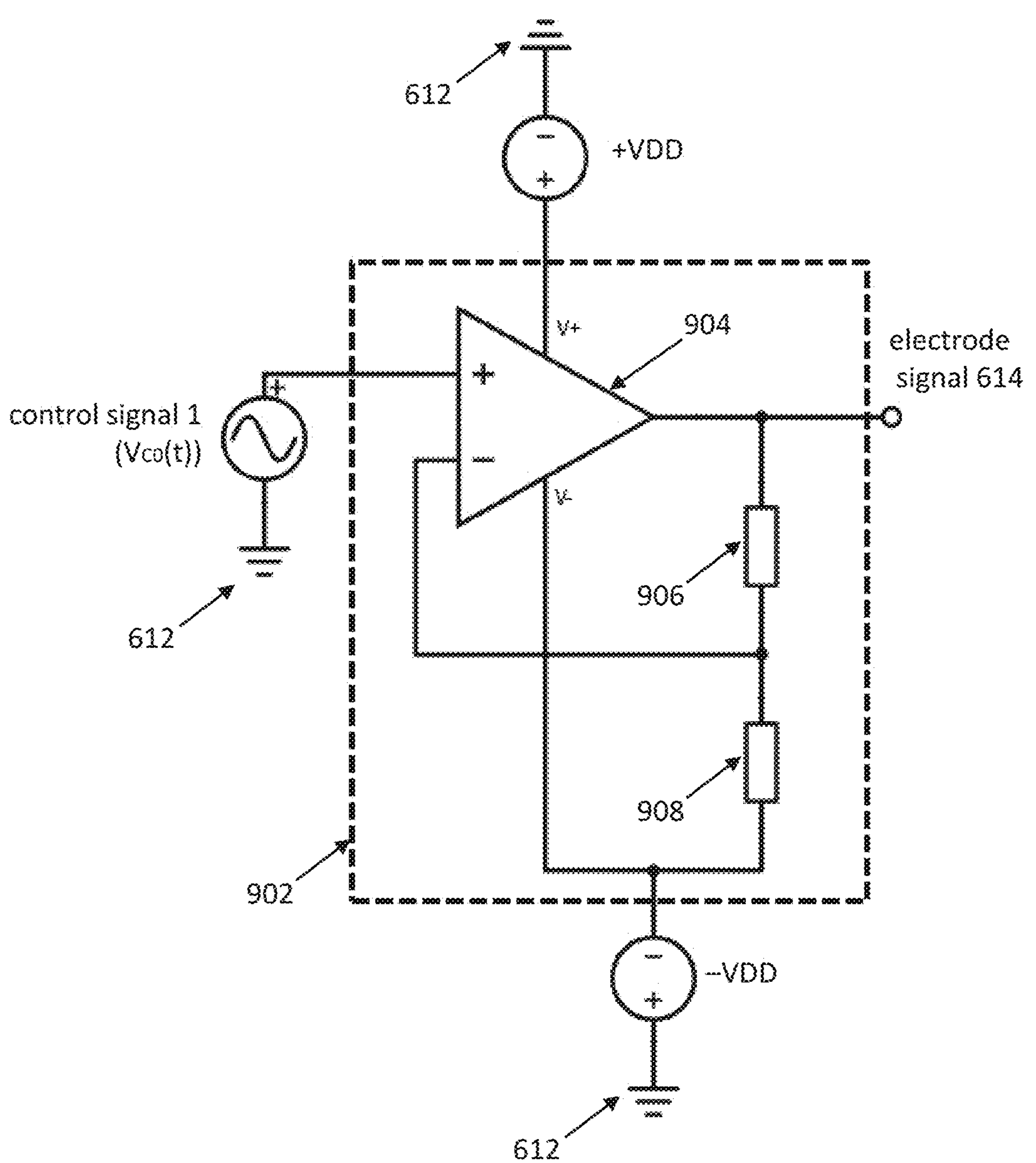
FIG. 9 shows an example implementations of the first drive circuit 610 in FIG. 6 according to an exemplary embodiment of the invention.

FIG. 9 shows an exemplary implementation of a first drive circuit 610 in FIG. 6 according to an exemplary embodiment. Assuming that the reference potential 612 is the ground potential, the drive signal VC0(*t*) is provided as an input of the non-inverting amplifier stage 902 which is exemplified by the circuit arrangement of the operational amplifier 904 and the two resistances 906, 908, which amplify the drive signal VC0(*t*) at the noninverting input of the operational amplifier 904 relative to the voltage potentials +VDD and −VDD so that the resultant electrode signal 614 varies in between those two voltage potentials +VDD and −VDD. The drive signal VC0(*t*) may for example correspond to the control signal 1 generated using the circuitry in FIG. 7 or FIG. 8. Please note the depicted implementation in FIG. 9 using an operational amplifier 904 and two resistances 906, 908 is only exemplary and other implementations of a non-inverting amplification stage 902 can be used.

Figure 10:
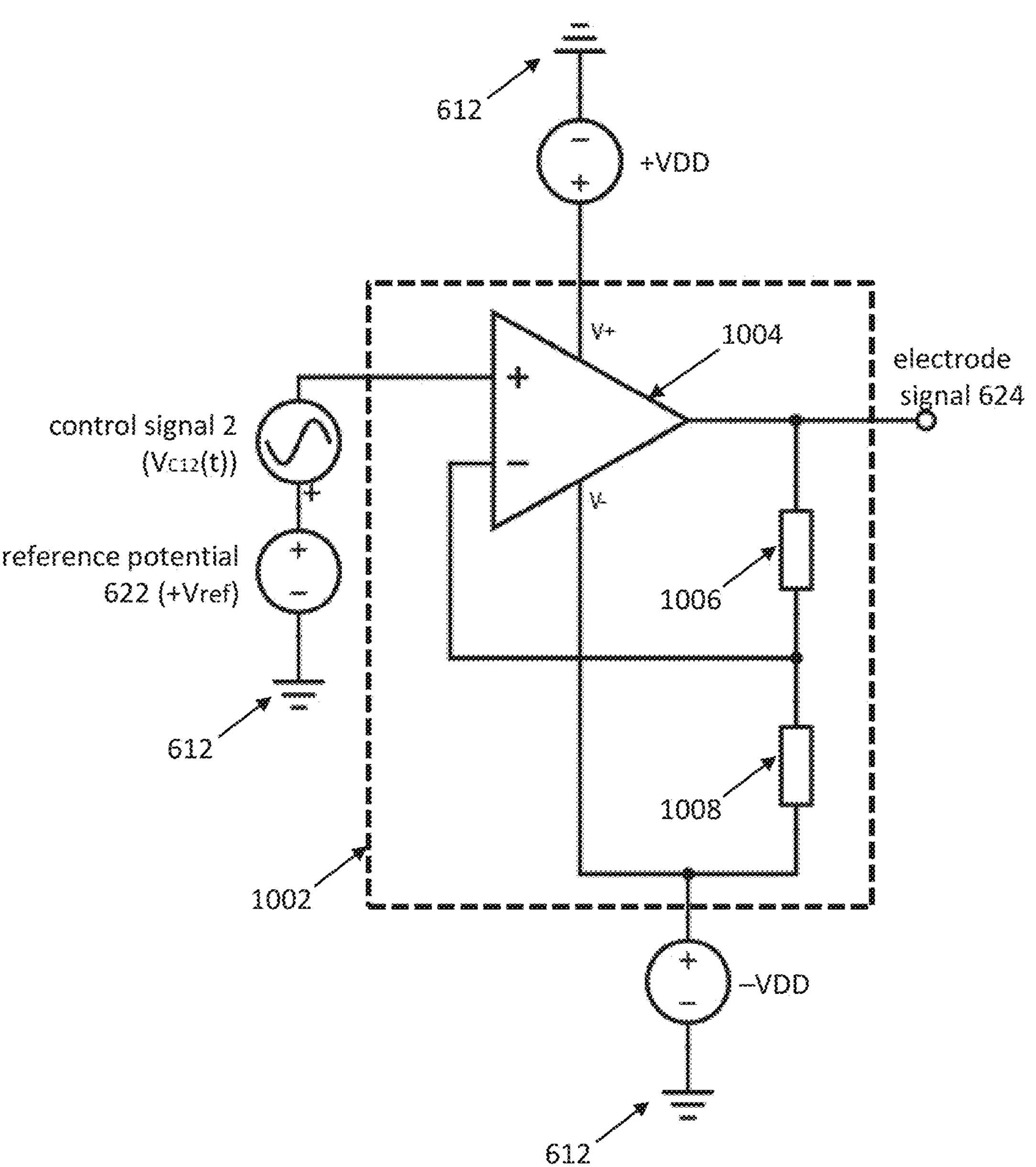
FIG. 10 shows an example implementations of the first drive circuit 620 in FIG. 6 according to an exemplary embodiment of the invention.

FIG. 10 shows an exemplary implementation of the second drive circuit 620 in FIG. 6 according to an exemplary embodiment. The non-inverting amplifier stage 1002 is substantially identical to the amplifier stage 902 in FIG. 9. Different from the first drive circuit 610 in FIG. 9, the drive signal VC12(*t*) (which is 180° phase shifted relative to drive signal VC0(*t*)) is initially offset by the reference potential 622 ($+V_{ref}$) from the ground potential 612 (or in general, from the first reference potential 612). The amplifier stage 1002 comprises an operational amplifier 1004 and the two resistances 1006, 1008, which amplify drive signal VC12(*t*) at the noninverting input of the operational amplifier 1004 relative to the voltage potentials +VDD and −VDD so that the resultant electrode signal 624 varies in between those two voltage potentials +VDD and −VDD. Due to the offset introduced by the reference potential 622 ($+V_{ref}$), also the electrode signal 624 is offset by a predetermined potential difference from the electrode signal 614 which is proportional to the potential difference between the reference potential 622 and the reference potential 612. The drive signal VC12(*t*) may for example correspond to the control signal 2 generated using the circuitry in FIG. 7 or FIG. 8. Please note the depicted implementation in FIG. 10 using an operational amplifier 1004 and two resistances 1006, 1008 is only exemplary and other implementations of a non-inverting amplification stage 1002 can be used. It is however advantageous that the implementation of the amplifier stage 1002 is similar to that of amplifier stage 902 in FIG. 9.

Figure 11:
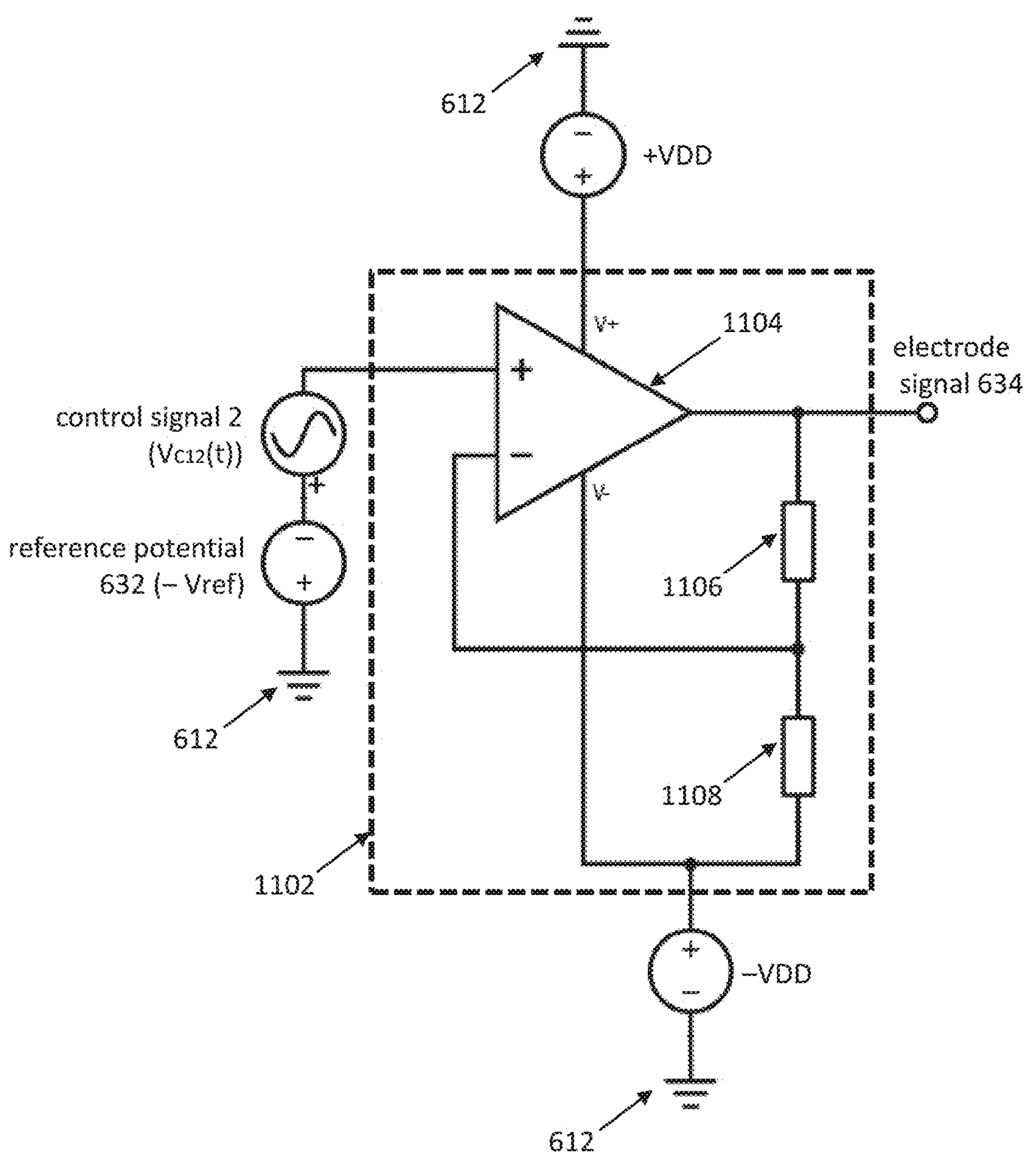
FIG. 11 shows an example implementations of the third drive circuit 630 in FIG. 6 according to an exemplary embodiment of the invention.

FIG. 11 shows an exemplary implementation of the third drive circuit 630 in FIG. 6 according to an exemplary embodiment. The non-inverting amplifier stage 1102 is substantially identical to the amplifier stages 902 and 1002 in FIG. 9 and FIG. 10. The third drive circuit 630 of FIG. 11 is substantially identical to second drive circuit 620 as implemented in FIG. 10, except for the offset of the drive signal VC12(*t*) (which is 180° phase shifted relative to drive signal VC0(*t*) by the reference potential 632 ($-V_{ref}$) instead of the reference potential 622 ($+V_{ref}$). The amplifier stage 1102 comprises an operational amplifier 1104 and the two resistances 1106, 1108, which amplify the drive signal VC12(*t*) at the noninverting input of the operational amplifier 1104 relative to the voltage potentials +VDD and −VDD so that the resultant electrode signal 634 varies in between those two voltage potentials +VDD and −VDD. Due to the offset introduced by the reference potential 632 ($-V_{ref}$), also the electrode signal 634 is offset by a predetermined potential difference from the electrode signal 614 which is proportional to the potential difference between the reference potential 632 and the reference potential 612. The drive signal VC12(*t*) may for example correspond to the control signal 2 generated using the circuitry in FIG. 7 or FIG. 8. Please note the depicted implementation in FIG. 11 using an operational amplifier 1104 and two resistances 1106, 1108 is only exemplary and other implementations of a non-inverting amplification stage 1102 can be used. It is however advantageous that the implementation of the amplifier stage 1102 is similar to that of amplifier stage 902 in FIG. 9 and amplifier stage 1002 of FIG. 10.

In further embodiments, instead of using the circuitry as shown in FIGS. 7 and 8 for the generation of differential control signals 1 and 2, the amplifier stages 1002 and 1102 in FIG. 10 and FIG. 11 might also be implemented as an inverting amplifier stage. Alternatively, the amplifier stage 902 in FIG. 9 could be implemented as an inverting amplifier stage. Otherwise, the circuit configuration of FIGS. 9-11 would not require further modification.

Figure 12:
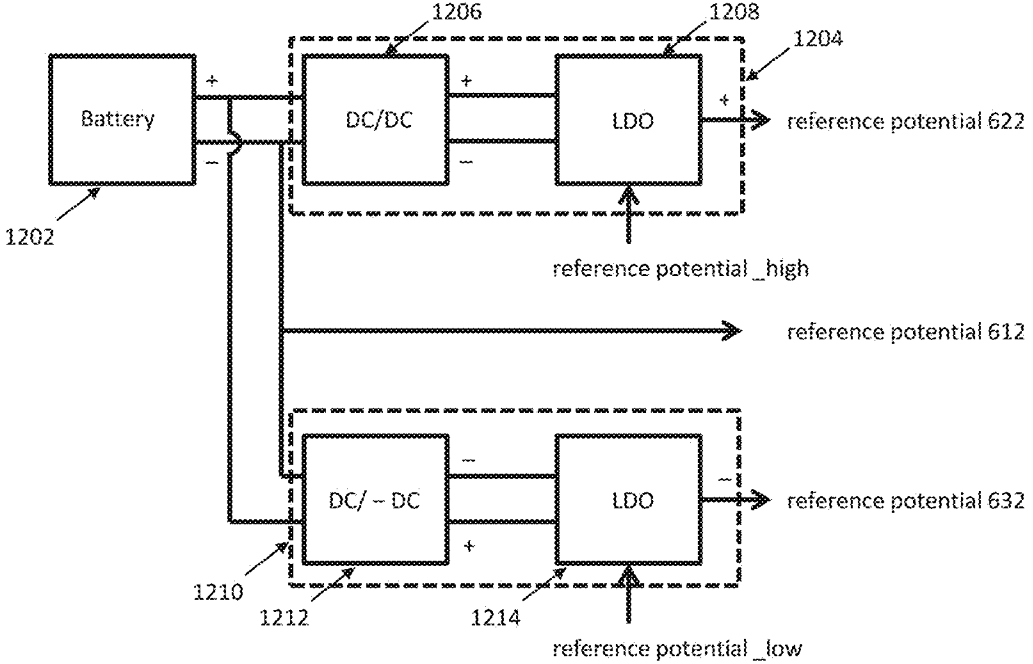
FIG. 12 shows an exemplary circuitry to derive the reference potentials 612, 622 and 632 in FIG. 6 from the potentials offered by a battery 1202, according to an exemplary embodiment of the invention.

As indicated above, the one or more drive unit 602 may be part and the drive circuitry 600 may be powered from any arbitrary suitable power source. In some embodiments, the drive circuitry 600 is powered from a battery, serving as a DC power source. In those embodiments, reference potentials 612, 622 and 632 may be derived from the plus potential and minus potential of the battery. FIG. 12 shows an exemplary circuitry to derive the reference potentials 612, 622 and 632 from the potentials offered by the battery 1202. In the depicted example, the reference potential 612, which may be defined as the common ground, may be directly obtained from and corresponding to the minus potential of the battery 1202. The reference potential 622 and 632 are derived by providing two constant voltage sources 1204 and 1210. The constant voltage source 1204 comprises a DC/DC converter 1206 and a low dropout (LDO) regulator 1208, which provides the reference potential 622. Similarly, the constant voltage source 1210 comprises a DC/−DC converter 1212 and a LDO regulator 1214, which provides the reference potential 632. Please note that the DC/−DC converter 1212 is an inverting DC/DC converter as well known in the art. Optionally, if the reference potential 612 should be different from the common ground (i.e. in this example, the minus potential of the battery 1202), the reference potential 612 can be derived using a further DC/DC converter stage similar to the DC/DC converter stage 1204.

Figure 13:
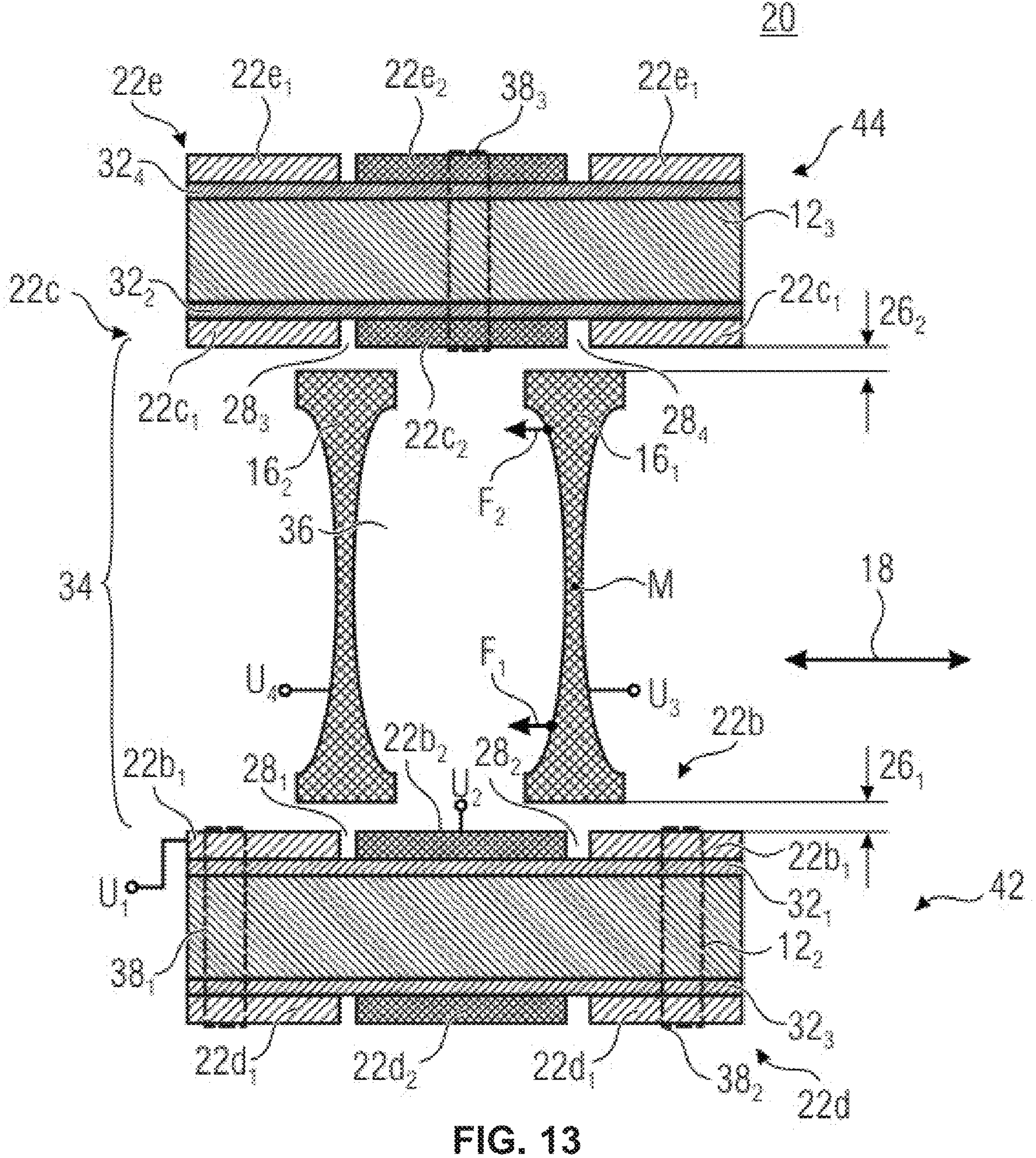
FIG. 13 shows an exemplary drive unit, which is an example implementation of the drive unit 602 in FIG. 6, according to an embodiment of the invention.

FIG. 13 shows an exemplary drive unit, which is an example implementation of the drive unit 602 in FIG. 6. FIG. 13 correspond to FIG. 2*a* of the parallel PCT application no. PCT/EP2020/084506 which has been filed on 4 Dec. 2020, and which is incorporated herein by reference. It should be noted that in this particular example, the drive unit 602 comprises two movable elements $\mathbf{16}_1$ and $\mathbf{16}_2$ that move in the same plane. FIG. 13 shows a schematic side sectional view of a section of a MEMS device 20 forming a drive unit. The drive structure 22*b* of the driving unit is, for example, a structured electrode structure and comprises at least one electrode element $\mathbf{22}b_1$ and one electrode element $\mathbf{22}b_2$, which are electrically insulated from each other so that a first electrical potential can be applied to the electrode element $\mathbf{22}b_1$ and a second electrical potential different therefrom can be applied to the electrode element $\mathbf{22}b_2$. Electrode element $\mathbf{22}b_1$ corresponds to the second electrode E1 of FIG. 6 and electrode element $\mathbf{22}b_2$ corresponds to the third electrode E2 in FIG. 6, or vice versa. In the example shown, the electrode signal 624 of FIG. 6 would be applied to the electrode element $\mathbf{22}b_1$ and the electrode signal 634 would be applied to the electrode element $\mathbf{22}b_2$ (or vice versa).

For electrical insulation, gaps $\mathbf{28}_1$ to $\mathbf{28}_4$ may be provided between the electrode segments $\mathbf{22}b_1$ and $\mathbf{22}b_2$, which may optionally be filled with electrically insulating material or dielectric material.

The MEMS device 20 may include a plurality or plurality of movable elements $\mathbf{16}_1$ and $\mathbf{16}_2$, and optionally other movable elements, arranged side-by-side along the plane direction 18. According to embodiment the movable elements $\mathbf{16}_1$ and $\mathbf{16}_2$ or their drive structures are electrically or galvanically connected to each other and correspond to respective electrode elements E0. The movable element $\mathbf{16}_1$ may be arranged symmetrically opposite the electrode gap $\mathbf{28}_2$, for example to obtain symmetrical actuation. Alternatively, it is also possible to arrange the movable element asymmetrically opposite the electrode gap $\mathbf{28}_2$, for example to obtain asymmetrical actuation. Similarly, the movable element $\mathbf{16}_2$ may be arranged symmetrically or asymmetrically opposite the electrode gap $\mathbf{28}_1$.

The electrode signal 614 discussed in connection with FIG. 6 can be applied to the movable elements $\mathbf{16}_1$ and $\mathbf{16}_2$ (note that electrode signal 614 corresponds to the reference numerals "$U_3$" and "$U_4$" in FIG. 13). Based on the electrode signals 614, 624 and 634 (note that electrode signal 624 corresponds to the reference numeral "$U_1$" and electrode signal 634 corresponds to the reference numeral "$U_2$" in FIG. 13, or vice versa) applied to the movable elements $\mathbf{16}_1$ and $\mathbf{16}_2$ (each serving as or having a first electrode E0) and the electrode elements $\mathbf{22}b_1$ and $\mathbf{22}b_2$, electrostatic forces can be generated that lead to a deflection of one or more movable elements $\mathbf{16}_1$ and $\mathbf{16}_2$ in opposite directions along the direction of movement of the plane direction 18.

The drive structure 22*b* may comprise an electrode structure which is preferably formed in a structured manner, such as in the form of interdigital electrodes. That is, further electrode elements connectable to the third electrode signal 634 may also be part of the drive structure 22*b*. According to further embodiments, however, individual electrode segments may also be electrically isolated from each other, so that, for example, the electrode elements collectively provided with reference numeral $\mathbf{22}b_1$ form electrode elements that are individually connectable to potentials.

As it is shown in FIG. 13, additional drive structures 22*c*, 22*d* and/or 22*e* may be arranged at the movable elements $\mathbf{16}_1$ and $\mathbf{16}_2$ facing and/or opposite sides of the layers $\mathbf{12}_2$ and $\mathbf{12}_3$. The additional drive structures 22*c*, 22*d* and 22*e* are optional. In particular, the drive structures 22_d_ and 22_e_ may be provided in a stacked arrangement of the MEMS device for arranging additional movable elements 16. Similarly, as the movable elements $\mathbf{16}_1$ and $\mathbf{16}_2$ are shown adjacent to the drive structures 22_b_ and 22_c_, additional movable elements may be arranged adjacent to the drive structures 22_d_ and/or 22_e_.

In the example shown in FIG. 13, the drive structure 22_c_ on the MEMS layer $\mathbf{12}_3$ or wafer 44 may be used to provide an additional drive force component between the movable element $\mathbf{16}_1$ and/or $\mathbf{16}_2$ and the drive structure 22_c_ in addition to the drive force component using the drive structure 22_b_. In the embodiment shown, the drive structure 22_c_ of the driving unit is, for example, a structured electrode structure and comprises at least one electrode element $\mathbf{22}c_1$ and one electrode element $\mathbf{22}c_2$, which are electrically insulated from each other so that a first electrical potential can be applied to the electrode element $\mathbf{22}c_1$ and a second electrical potential different therefrom can be applied to the electrode element $\mathbf{22}c_2$. Electrode element $\mathbf{22}c_1$ corresponds to the second electrode E1 of FIG. 6 and electrode element $\mathbf{22}b_2$ corresponds to the third electrode E2 in FIG. 6, or vice versa. In the example shown, the electrode signal 624 of FIG. 6 would be applied to the electrode element $\mathbf{22}c_1$ and the electrode signal 634 would be applied to the electrode element $\mathbf{22}c_2$ (or vice versa).

For electrical insulation, gaps $\mathbf{28}_1$ to $\mathbf{28}_4$ may be provided between the electrode segments $\mathbf{22}c_1$ and $\mathbf{22}c_2$, which may optionally be filled with electrically insulating material or dielectric material.

The drive unit may comprise further drive structure which may be arranged on a side of the MEMS layer $\mathbf{12}_2$ and/or $\mathbf{12}_3$ remote from the movable element $\mathbf{16}_1$ and/or $\mathbf{16}_2$ where one or more further movable elements may be arranged adjacent to said drive structure to form a stacked arrangement with the movable element $\mathbf{16}_1$ and $\mathbf{16}_2$.

The electrode structures may, for example, be connected to the layers $\mathbf{12}_2$ and/or $\mathbf{12}_3$ via interconnection layers $\mathbf{32}_1$ to $\mathbf{32}_4$, which may be particularly advantageous if the layers $\mathbf{12}_2$ and/or $\mathbf{12}_3$ are formed from semiconductor material. The layers $\mathbf{32}_1$ to $\mathbf{32}_4$ may, for example, be formed in an electrically insulating manner and comprise, for example, silicon oxide and/or silicon nitride. Other material choices are also possible without limitation.

The movable elements $\mathbf{16}_1$ and $\mathbf{16}_2$ may optionally be arranged symmetrically across the columns $\mathbf{28}_1$ to $\mathbf{28}_4$ which may enable symmetrical control of the movable elements $\mathbf{16}_1$ and $\mathbf{16}_2$, for example for linear movement.

Applying the differential electrode signals 614, 624 and 634 to the electrode structure 22_b_ and the optional electrode structure 22_c_ as described hereinabove causes the movable elements $\mathbf{16}_1$ and $\mathbf{16}_2$ to move toward and away from each other during a drive cycle, but alternatively move in phase, such that, for example, a distance between the movable elements $\mathbf{16}_1$ and $\mathbf{16}_2$ is changed equally or only insignificantly. For fluidic exchange with an environment, openings $\mathbf{38}_1$ to $\mathbf{38}_3$ may be provided for this purpose in any number and/or position in a first wafer 42 and/or second wafer 44 which may provide, for example, a bottom wafer and/or top wafer between which the movable element $\mathbf{16}_1$ and/or $\mathbf{16}_2$ is arranged so that fluid can flow into or out of the partial cavity 36. When using the MEMS device 20 as a sound-generating device, sound pressure can be emitted via the openings $\mathbf{38}_1$ to $\mathbf{38}_3$.

Figures 14A, 14B:
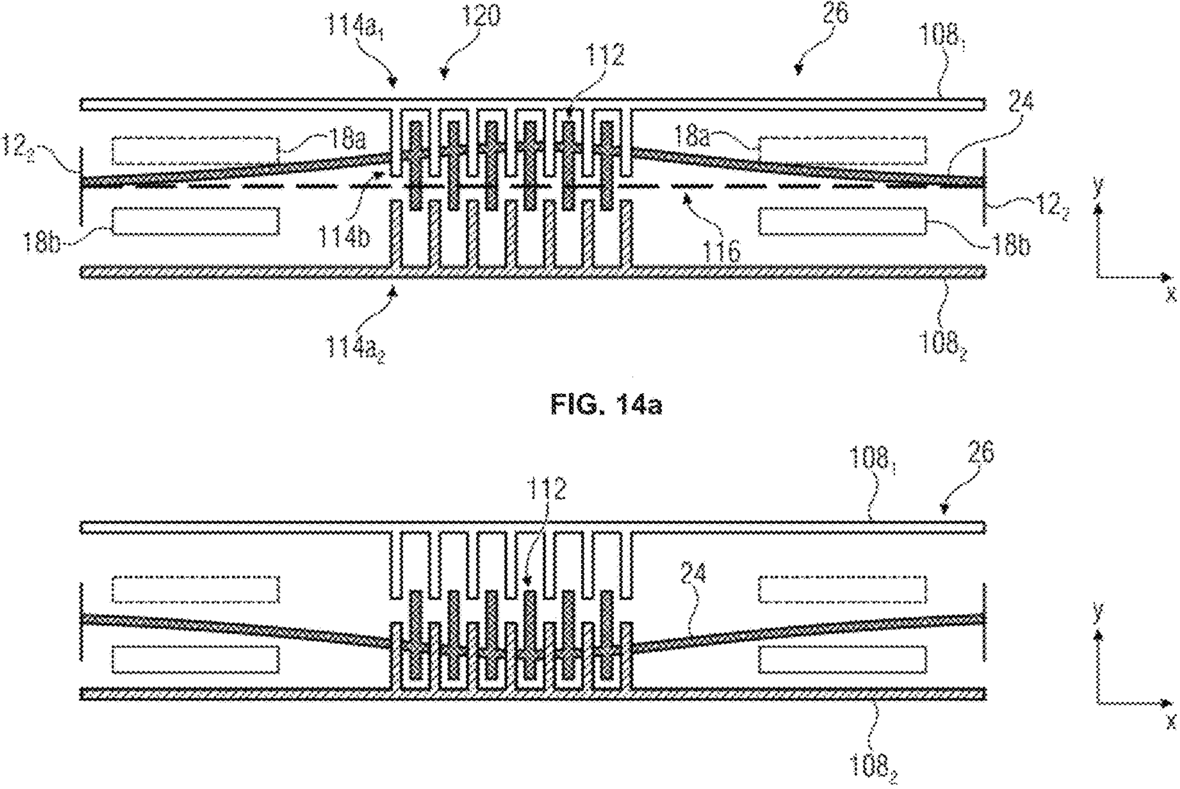
FIG. 14*a* shows a schematic top view of a part of an active structure, which is an example implementation of the drive unit 602 in FIG. 6, in a first state according to an embodiment of the invention.
FIG. 14*b* a complementary state of the active structure to FIG. 14*a;*

FIG. 14_a_ shows a schematic top view of a portion of an active structure 26 of a MEMS 120 according to embodiments of the invention that can be used as a drive unit 602 in the example embodiment of FIG. 6. FIGS. 14_a-d_ correspond to FIGS. 12_a-d_ of the parallel PCT application no. PCT/EP2020/062901 which has been filed on 8 May 2020, and which is incorporated herein by reference.

In FIG. 14_a_, stator electrodes $\mathbf{108}_1$ and $\mathbf{108}_2$ are arranged opposite each other and provided with a comb electrode structure $\mathbf{114}a_1$ and $\mathbf{114}a_2$. A movable electrode 112 is provided between electrodes $\mathbf{108}_1$ and $\mathbf{108}_2$. The movable electrode 112 is provided with a comb electrode structure 114_b_. In the depicted example embodiment, the stator electrodes $\mathbf{108}_1$ and $\mathbf{108}_2$ corresponds to the outer electrodes E1 and E2 depicted in FIG. 6. The movable electrode 112 corresponds to the center electrode E0 depicted in FIG. 6. Movable electrode 112 can be triggered to move relative to the stator electrodes $\mathbf{108}_1$ and $\mathbf{108}_2$ by applying electrode signals 614, 624 and 634 as outlined in connection with FIG. 6. The electrode signal 614 is applied to the movable electrode 112. Electrode signals 624 and 634 are applied to the stator electrodes $\mathbf{108}_1$ and $\mathbf{108}_2$. FIG. 14_b_ shows a complementary state to FIG. 14_a_, in which the movable electrode 112 is deflected towards the stator electrode $\mathbf{108}_2$ relative to a reference state 116. Through openings 18_a_ and 18_b_ in the bottom and top wafers may be provided. When using the MEMS 120 in a sound-generating device, the sound pressure generated by the movement of the movable electrode 112 is emitted through the openings 18_a_ and 18_b_.

In other words, FIGS. 14_a_ and 14_b_ present a further embodiment of the concept according to the opening in a top view. Here, the actuator within the drive plane follows the stator-shuttle principle. The fixed perimeter $\mathbf{108}_1$ and $\mathbf{108}_2$ of the actuators are provided with comb-like deflectable elements 114_b_, which interlock with comb-like non-deflectable counter elements $\mathbf{114}a_1$ and $\mathbf{114}a_2$ connected to the substrate. In a first time interval of the drive period, shown in FIG. 14_a_, deflection of the comb-like deflectable elements 114_b_ occurs in a first direction of movement. In a second time interval of the drive period, which is shown in FIG. 14_b_, the movement of the comb-like, deflectable elements 114_b_ takes place in a second direction of movement opposite to the first direction. The deflection occurs in-plane and perpendicular to the direction of extension of the resistance element or the interaction structure 24 arranged in another plane. The passive resistance elements of the interaction structure 24 arranged in the plane of displacement may be connected to the surrounding substrate, such as the layer $\mathbf{12}_2$, on both sides. The resistive elements may be extended into the active device plane where they may be driven. The movement of the actively deflectable elements, i.e., the comb electrode structures arranged in the plane 142, can occur due to the resulting force due to the potential difference between the electrode structures $\mathbf{114}a_1$/$\mathbf{114}a_2$ on the one hand and 114_b_ on the other hand. The length of the deflectable comb-like elements may be approximately 40 to 80% of the length of the resistive elements.

The electrode pairs of the actively deflectable structures can thus be formed as interlocking electrode comb structures. For this purpose, a third electrode with an electrode comb structure may be associated with a respective electrode pair to form a group of three electrodes, exemplarily shown in FIGS. 14_a_ and 14_b_. According to embodiments, an active structure provides for a plurality of such "cells" (drive units 602), which may be arranged in one or more rows according to the embodiments described herein. The rows may be arranged parallel to each other, for example to generate a high force. Alternatively or additionally, it is possible to arrange rows inclined to each other to generate an at least two-dimensional movement of the interaction structure or, in other words, a 2D movement of the interaction structure can be obtained by the inclined, non-parallel arrangement of the rows of actuators. The middle of the three electrodes can be deflected in different directions based on an alternating application of the outer electrodes.

Figures 14C, 14D:
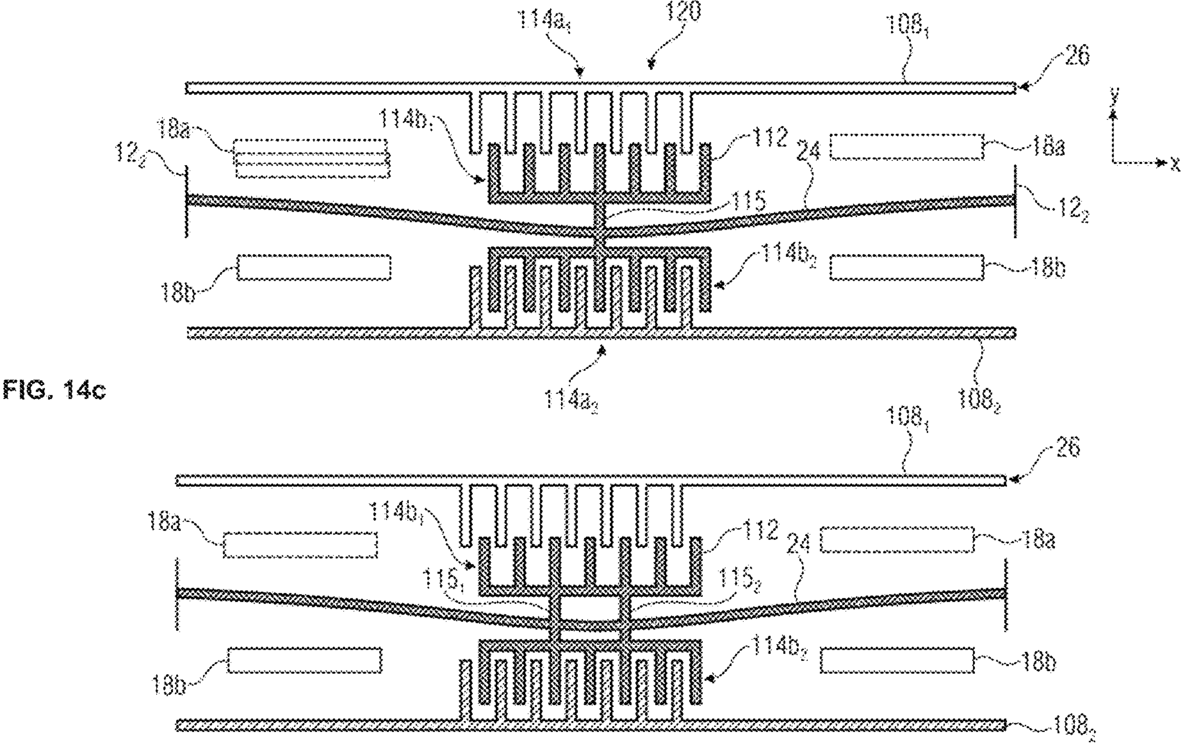
FIG. 14*c-d* show schematic views of embodiments of an alternative active structure, which is an example implementation of the drive unit 602 in FIG. 6, of a MEMS in which comb electrodes facing fixed electrodes are spatially separated from each other along the y-direction.

FIG. 14*c* shows a schematic top view of the active structure 26 of the MEMS 120, in which the comb electrodes facing the fixed electrodes 114*a*$_1$ and 114*a*$_2$, respectively, are spatially separated from each other along the y-direction to form comb electrode elements 114*b*$_1$ and 114*b*$_2$ that are connectable to a same potential or electrically conductively connected to each other. This can cause a spatial expansion of the comb electrode drive along the direction of movement y, which can enable large amplitudes of movement.

A bending line of the fin of the interaction structure and/or of the structure suspending the comb elements 114*b*$_1$ and 114*b*$_2$ can be adjusted via a number and/or a location of connecting structures 115 or 1151 and 1152, the number of which can be at least 1 (see FIG. 14*c*), at least 2 (see FIG. 14*d*) or higher.

Figure 15:
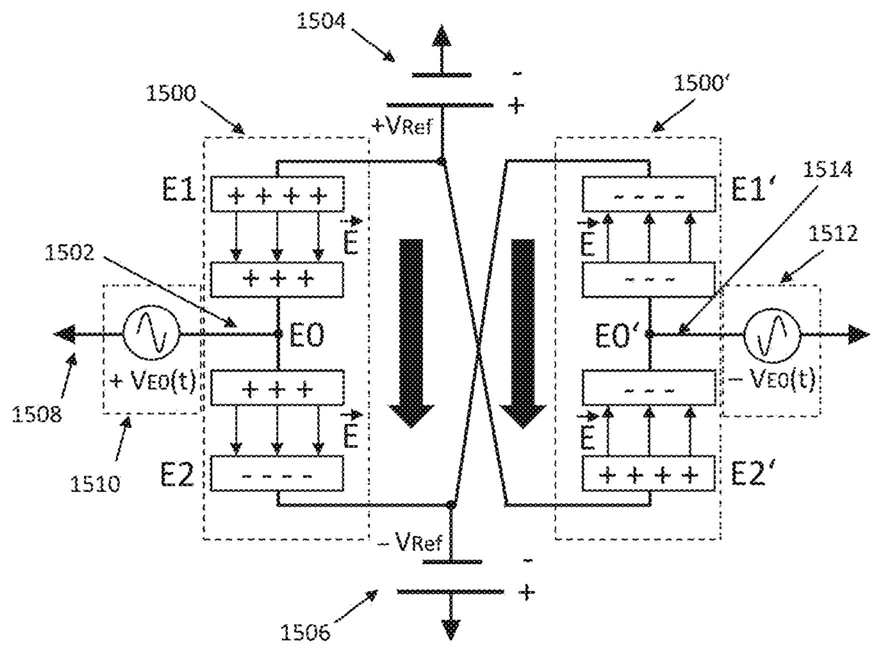
FIGS. 15 and 16 show two alternative schematic structures of a six electrodes electrostatic drive according to different exemplary embodiments of the invention.
Figure 16:
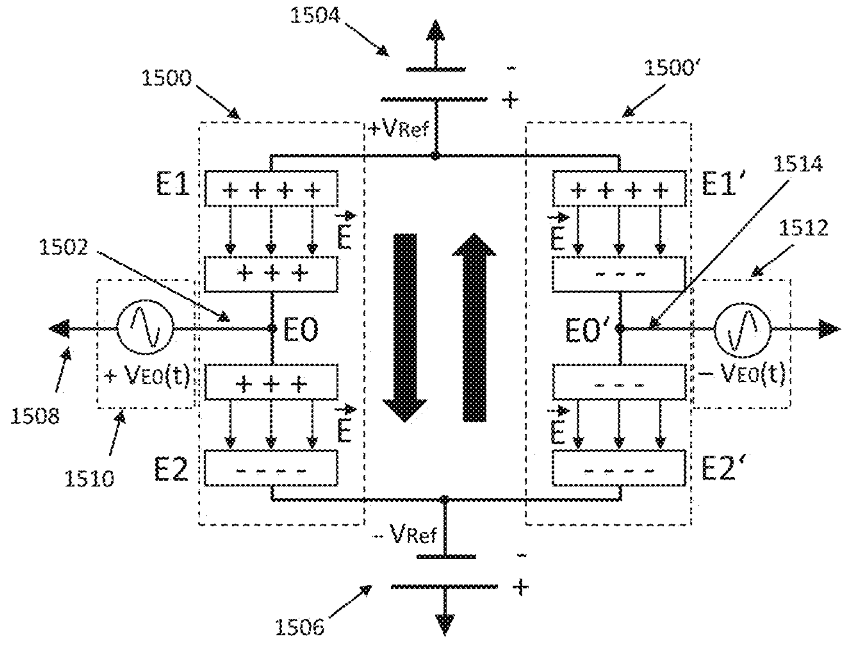

Some embodiments show that differential driving and compensation of the capacitive coupling can be achieved by adding a mirrored electrostatic drive or a structure having exactly the same properties. FIGS. 15 and 16 schematically shows two possible implementations of such embodiments.

The single-phase driving scheme of FIG. 3 discussed above has been taken as the basis for the example embodiments shown in FIGS. 15 and 16. Similar to FIG. 3, only the central electrode E0 is driven by a drive circuit 1510 using an alternating drive signal $+V_{E0}(t)$. The drive circuit 1510 applies the electrode signal 1502, which is based on the drive signal $+V_{E0}(t)$, to the central electrode. The two outer electrodes E1 and E2 can be charged with voltage potentials 1504 and 1506 of opposite polarities, as indicated by "$+V_{ref}$" and "$-V_{ref}$" in FIGS. 15 and 16. The central electrode E0 and the outer electrodes E1 and E2 form drive unit 1500. A capacitively coupled alternating voltage signal of the center electrode E0 can be compensated by adding a mirrored electrostatic drive unit 1500' including another center electrode E0' and two additional outer electrodes E1' and E2'. The center electrode E0' is fed by a drive circuit 1512 with an electrode signal 1514 that is based on the drive signal $-V_{E0}(t)$, which is the same signal as the drive signal $+V_{E0}(t)$, but is phase shifted by 180° (which is indicated by the minus sign). The drive circuits 1510 and 1512 can be realized in a similar fashion as shown in FIG. 9. The only difference would be that the drive signal used by the drive circuit 1510 is a 180° phase shifted version of the drive signal of the drive circuit 1512. The inversed drive signal can be generated using the circuitry described in connection with FIGS. 7 and 8 above. Alternatively, instead of using different phase shifted drive signals, the drive circuits 1510 and 1512 could both be using the same drive signal, but one of the drive circuits 1510 and 1512 implements an inverting amplifier stage. The capacitive coupling described in connection with the single-phase driving scheme of FIG. 3 above can be compensated by the opposite driving of the mirrored electrode E0'. If the voltage at electrode E0 rises, the potentials at electrodes E1 and E2 are increased via the capacitance $C_{E0E1}$ between the electrodes E0 and E1 and capacitance $C_{E0E2}$ between the electrodes E0 and E2. At the same time, however, the electrode E0' attempts to reduce its potential by the signal differential to electrode E0. This change is capacitively coupled via the capacitance $C_{E0'E1'}$ between the electrodes E0' and E1' and capacitance $C_{E0'E2'}$ between electrodes E0' and E2' which are coupled also to electrodes E1 and E2 by connection between electrodes E2 and E1' and electrodes E1 and E2' in FIG. 15 and the connection between electrodes E1 and E1' and electrodes E2 and E2' in FIG. 16. If both mirrored arrangements are exactly the same in terms of physical behavior and/or properties, the capacitively coupled potential changes cancel each other completely. For the resulting movements of the central electrodes E0 and E0', a deflection of the central electrodes E0 and E0' in opposite directions can be achieved when coupling electrode E1 to electrode E1' and coupling electrode E2 to electrode E2' as shown in FIG. 16. Accordingly, in those embodiments, the central electrodes E0 and E0' should be provided on or realized by different movable elements in a single or different drive units. Deflection of the central electrodes E0 and E0' in the same direction can be achieved when coupling electrode E1 to electrode E2' and the electrode E2 to the electrode E1' as shown in FIG. 15. Accordingly, in those embodiments, the central electrodes E0 and E0' may be provided on or realized by different movable elements in a single or different drive units, or may be provided on a same movable element in a single drive unit. Instead of adding an identically constructed mirrored drive unit 1500', any other arrangement could also be added to the drive unit 1500, as long as this other arrangement exactly mirrors the behavior of the drive unit 1500.

Figure 17:
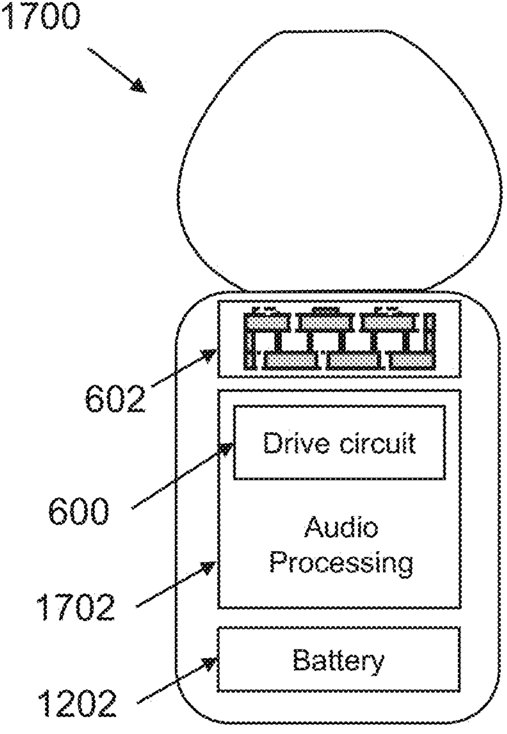
FIG. 17 show an exemplary embodiment of a micromechanical loudspeaker system using an electrostatic drive mechanism as discussed in connection with FIGS. 6 to 16.

FIG. 17 illustrates an example embodiment of a micromechanical loudspeaker system 1700, which is—in this example—implemented as an in-ear headphone. The micromechanical loudspeaker system may for example include one or more of drive circuitry 600 and a sound-generating device which is provided with one or more drive units 602. Furthermore, the micromechanical loudspeaker system 1700 includes an audio processing unit 1702 which may provide an audio signal based on which the one or more of drive circuitry 600 and a sound-generating device are to generate sound. The audio signal may be either a digital signal or an analog signal. As described in connection with FIGS. 6 to 13, the audio processing unit 1702 may be the signal source providing the audio signal as the source signal (see FIGS. 7 and 8). The micromechanical loudspeaker system 1700 may include a battery 1202 that powers the processing unit 1702 and the one or more drive circuitry 600. The battery 1202 may also be used to power any other components requiring power within the micromechanical loudspeaker system 1700. Although not shown in FIG. 17, the micromechanical loudspeaker system 1700 may further include components that facilitate Bluetooth connectivity to external devices (for example a mobile phone, laptop, tablet computer, etc.) to provide an audio signal to be outputted by the micromechanical loudspeaker system 1700. In addition or alternatively, components of the micromechanical loudspeaker system 1700 may provide Wi-Fi connectivity or cellular connectivity (e.g. according to 3GPP standards) for this purpose. Further in addition alternatively, the micromechanical loudspeaker system 1700 can include components facilitating wired or wireless charging of the battery 1202. Further, the micromechanical loudspeaker system 1700 could include a USB connector for charging and/or communication of data with an external device.

The electrostatic drive circuitry described in connection with FIGS. 6-16 may also be used in valve assemblies and pumps.

Figure 18:
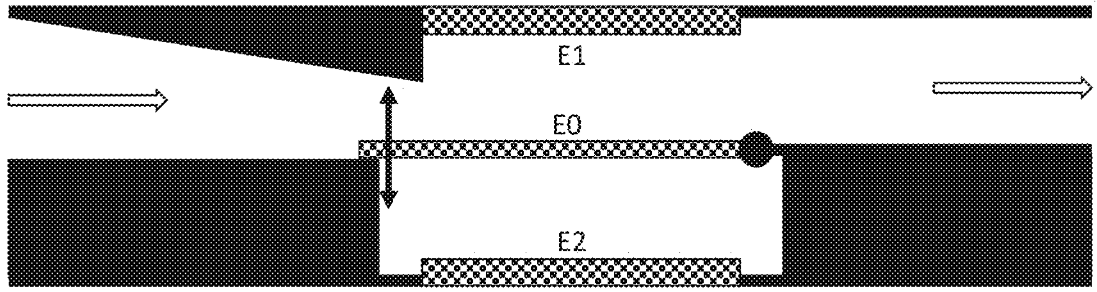
FIGS. 18-20 show different arrangements of a valve assembly using an electrostatic drive mechanism as discussed in connection with FIGS. 6 to 16, according to different embodiments of the invention.
Figure 19:
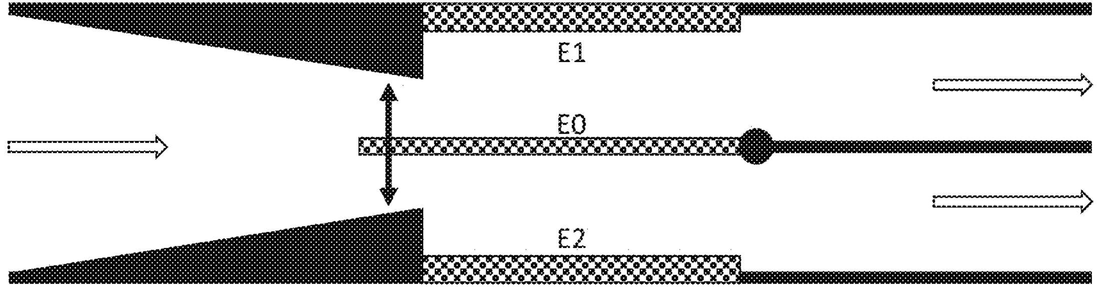
Figure 20:
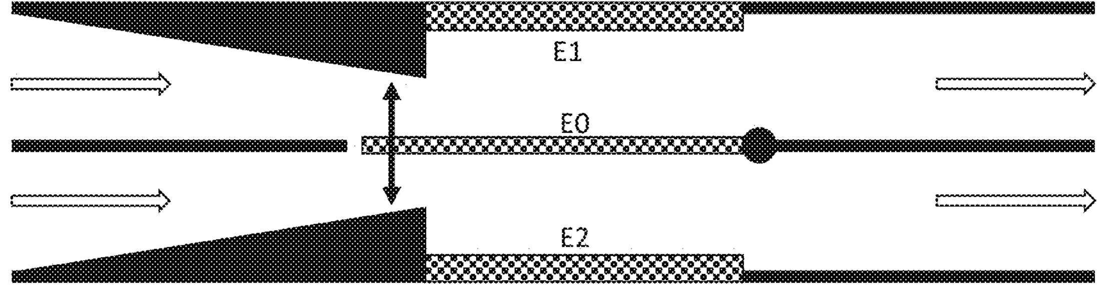

FIGS. 18-20 show different arrangements of a valve assembly, including a movable element associated with the electrode E0. The movable element can be displaced by differential driving of the outer electrodes E1 and E2, as in the embodiments described above. In FIG. 18, a simple valve assembly with a single input and a single output is shown. The movable element associated with the center electrode E0 can be displaced as depending to open and close the valve. Depending on the construction of the valve assembly, the movable element can be moved between an open position and a closed position only, i.e. in a "binary" fashion. Alternatively, it may be also possible to continuously or perform stepwise control of the position of the movable element, so as to regulate the flow of any fluid through the valve. FIG. 19 provides another exemplary valve assembly which is a two-way valve that has a single input and two outputs. In this embodiment the movable element associated with the center electrode E0 can be displaced so as to route the fluid either to the first output or the second output. Similar to the embodiment discussed in FIG. 18, the movable element may be moved between an open position and a closed position in the binary fashion only, continuously or stepwise to regulate the flow of the fluid from the input to either one of the outputs. FIG. 20 shows another exemplary embodiment of a valve assembly provided which is a 2/2 way valve with two inputs and two outputs. This valve assembly may mix the fluid received we have the two input streams and may redirect the next fluid to either one of the first or the second output by moving the movable element associated with the center electrode E0 in a binary fashion.

Figure 21:
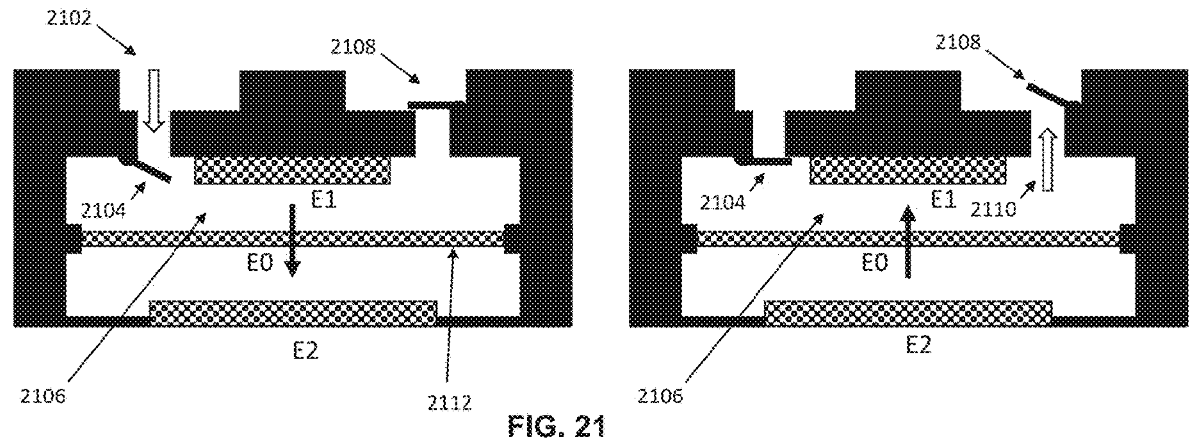
FIG. 21 shows an exemplary embodiment of a pump using an electrostatic drive mechanism as discussed in connection with FIGS. 6 to 16.

FIG. 21 shows an exemplary embodiment of a pump which utilizes the electrostatic drive circuitry described in connection with FIGS. 6-16 hereinabove. FIG. 21 is an example of the diaphragm pump, where the diaphragm 2112 constitutes the movable element associated with the center electrode E0 in the above examples. The diaphragm valve may be for example suitable for use in microfluidics. On the left side of FIG. 21, in a first portion of a pump cycle, the volume of the pump chamber 2106 is increased by deflecting the diaphragm 2112 towards the electrode E2 by means of differential driving as described in connection with FIG. 6-16. This causes the fluid 2102 to enter through the valve 2104 into the pump chamber 2106. In the second portion of the pump cycle, the volume of the pump chamber 2106 is decreased by deflecting the diaphragm 2112 towards the electrode E1 by means of differential driving as described in connection with FIG. 6-16. This causes the fluid 2110 to leave the pump chamber 2106 through the valve 2108. The valves 2104 and 2108 may form a non-return check valve. By repeating the pump cycle, the fluid may thus be pumped from the pump inlet on the left side of the diaphragm pump to the pump outlet on the right side of the diaphragm pump.

The invention claimed is:

1. An apparatus for driving an electrostatic drive unit of a sound-generating device, wherein the drive unit has a movable element having a first electrode, which is electrostatically drivable by means of a second electrode and a third electrode of the drive unit, wherein the apparatus comprises:

a first drive circuit, which is configured to generate a first electrode signal based on a first drive signal and relative to a first reference potential, and to drive the first electrode using the first electrode signal;

a second drive circuit, which is configured to generate a second electrode signal based on a second drive signal and relative to a second reference potential, which is higher than the first reference potential, and to drive the second electrode using the second electrode signal; and a third drive circuit, which is configured to generate a third electrode signal based on the second drive signal and relative to a third reference potential, which is lower than the first reference potential, and to drive the third electrode using the third electrode signal, wherein the second and third electrode signals are alternating voltage signals of the same phase, which correspond to each other in terms of their waveform, but are shifted with respect to one another by the potential difference between the second reference potential and the third reference potential; and wherein the first electrode signal is an alternating voltage signal that corresponds to the inverted waveform of the second and third electrode signals in terms of its waveform.

2. The apparatus according to claim 1, wherein the second and third electrode signals are alternating voltage signals of the same phase, which correspond to each other in terms of their waveform and amplitude, but are shifted with respect to one another by the potential difference between the second reference potential and the third reference potential.

3. The apparatus according to claim 1, wherein the magnitude of the potential difference between the second reference potential and the first reference potential is equal to the magnitude of the potential difference between the first reference potential and the third reference potential.

4. The apparatus according to claim 1, wherein the second drive signal and the third drive signal correspond to the first drive signal shifted in phase by 180°.

5. The apparatus according to claim 1, wherein potential of the second drive signal remains equal to or higher than the potential of the first drive signal when driving the drive unit.

6. The apparatus according to claim 1, wherein potential of the third drive signal remains equal to or lower than the potential of the first drive signal when driving the drive unit.

7. The apparatus according to claim 1, wherein at least one of the first drive signal, the second drive signal and the third drive signal is an audio signal.

8. The apparatus according to claim 1, wherein the first drive signal and the second drive signal are analog signals, and the apparatus further comprises an inverter circuit, which inverts the first drive signal to generate the second drive signal.

9. The apparatus according to claim 1, wherein the first drive signal and the second drive signal are analog signals, and the apparatus further comprises an inverter circuit, which inverts the second drive signal to generate the first drive signal.

10. The apparatus according to claim 1, wherein the first and second drive signals are analog signals, and the apparatus is further configured to receive a digital drive signal;

the apparatus further comprising:

an inverter, which inverts the digital drive signal; and a first digital-to-analog converter, which is configured to convert the digital drive signal into an analog signal corresponding to the first drive signal; and a second digital-to-analog converter, which is configured to convert the inverted digital drive signal into an analog signal corresponding to the second drive signal.

11. The apparatus according to claim 1, wherein the apparatus is further configured to receive a digital drive signal;

the apparatus further comprising an inverter, which inverts the digital drive signal; and wherein the first drive circuit is configured to drive the first electrode using the digital drive signal as the first drive signal; and wherein the second drive circuit and the third drive circuit are configured to drive the second electrode and the third electrode using the inverted drive signal as the second drive signal and third drive signal, respectively.

12. The apparatus according to claim 1, wherein the first drive signal and the second drive signal together form a differential drive signal for the electrodes.

13. The apparatus according to claim 12, wherein the differential drive signal is a symmetric differential drive signal or an asymmetric differential drive signal.

14. The apparatus according to claim 1, further comprising:

a second constant voltage source configured to provide the second reference potential to the second drive circuit; and a third constant voltage source configured to provide the third reference potential to the third drive circuit.

15. The apparatus according to claim 14, wherein the second constant voltage source comprises:

a DC/DC converter configured to receive a positive potential from a battery and to generate the second reference potential based on a positive potential of a battery powering the apparatus and the MEMS-based component, and a low-dropout (LDO) regulator configured to receive the second reference potential from the DC/DC converter and to provide a regulated second reference potential to the second drive circuit; and wherein third constant voltage source comprises:

a DC/−DC converter configured to receive the positive potential from the battery and to generate the third reference potential based on said positive potential of the battery, and a low-dropout (LDO) regulator configured to receive the third reference potential from the DC/−DC converter and to provide a regulated third reference potential to the third drive circuit.

16. The apparatus according to claim 14, wherein the first reference potential received by the first drive circuit is the negative potential of a battery powering the apparatus and the MEMS-based component.

17. The apparatus according to claim 14, further comprising a first constant voltage source configured to provide the first reference potential to the first drive circuit.

18. The apparatus according to claim 1, wherein the sound-generating device is a microelectromechanical sound-generating device implemented in a microelectromechanical system (MEMS).

19. A loudspeaker system comprising:

a sound-generating device, wherein the sound-generating device is configured to generate sound using one or more drive units, wherein each drive unit comprises a movable element having a first electrode, which is electrostatically drivable by means of a second electrode and a third electrode of the drive unit; and an apparatus comprising:

a first drive circuit, which is configured to generate a first electrode signal based on a first drive signal and relative to a first reference potential, and to drive the first electrode using the first electrode signal;

a second drive circuit, which is configured to generate a second electrode signal based on a second drive signal and relative to a second reference potential, which is higher than the first reference potential, and to drive the second electrode using the second electrode signal; and a third drive circuit, which is configured to generate a third electrode signal based on the second drive signal and relative to a third reference potential, which is lower than the first reference potential, and to drive the third electrode using the third electrode signal, wherein the second and third electrode signals are alternating voltage signals of the same phase, which correspond to each other in terms of their waveform, but are shifted with respect to one another by the potential difference between the second reference potential and the third reference potential; and wherein the first electrode signal is an alternating voltage signal that corresponds to the inverted waveform of the second and third electrode signals in terms of its waveform.

20. A method for driving an electrostatic drive unit of a sound-generating device, wherein the drive unit has a movable element having a first electrode, which is electrostatically drivable by means of a second electrode and a third electrode of the drive unit, wherein the method comprises:

generating a first electrode signal based on a first drive signal and relative to a first reference potential, and to drive the first electrode using the first electrode signal;

generating a second electrode signal based on a second drive signal and relative to a second reference potential, which is higher than the first reference potential, and to drive the second electrode using the second electrode signal; and generating a third electrode signal based on the second drive signal and relative to a third reference potential, which is lower than the first reference potential, and to drive the third electrode using the third electrode signal, wherein the second and third electrode signals are alternating voltage signals of the same phase, which correspond to each other in terms of their waveform, but are shifted with respect to one another by the potential difference between the second reference potential and the third reference potential; and wherein the first electrode signal is an alternating voltage signal that corresponds to the inverted waveform of the second and third electrode signals in terms of its waveform.

* * * * *